United States Patent
Lin et al.

(10) Patent No.: US 12,127,399 B2
(45) Date of Patent: Oct. 22, 2024

(54) ARRAY BOUNDARY STRUCTURE TO REDUCE DISHING

(71) Applicant: Taiwan Semiconductor Manufacturing Company, Ltd., Hsinchu (TW)

(72) Inventors: Meng-Han Lin, Hsinchu (TW); Te-Hsin Chiu, Miaoli County (TW); Wei-Cheng Wu, Zhubei (TW); Li-Feng Teng, Hsinchu (TW); Chien-Hung Chang, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/323,458

(22) Filed: May 25, 2023

(65) Prior Publication Data
US 2023/0301075 A1 Sep. 21, 2023

Related U.S. Application Data

(60) Continuation of application No. 17/555,828, filed on Dec. 20, 2021, now Pat. No. 11,706,914, which is a (Continued)

(51) Int. Cl.
*H01L 29/06* (2006.01)
*H01L 21/28* (2006.01)
(Continued)

(52) U.S. Cl.
CPC ....... *H10B 20/60* (2023.02); *H01L 21/76229* (2013.01); *H01L 21/765* (2013.01);
(Continued)

(58) Field of Classification Search
CPC ..... H10B 20/60; H01L 21/765; H01L 23/562; H01L 29/0649; H01L 29/404
(Continued)

(56) References Cited

U.S. PATENT DOCUMENTS

2003/0008459 A1   1/2003   Yuzuriha et al.
2004/0047217 A1   3/2004   Kamiya
(Continued)

FOREIGN PATENT DOCUMENTS

JP   2000232154 A   8/2000
JP   2008085101 A   4/2008
(Continued)

OTHER PUBLICATIONS

Non-Final Office Action dated Apr. 20, 2021 for U.S. Appl. No. 16/022,702.
(Continued)

*Primary Examiner* — Hoai V Pham
(74) *Attorney, Agent, or Firm* — Eschweiler & Potashnik, LLC

(57) ABSTRACT

A semiconductor structure including a semiconductor substrate and at least one patterned dielectric layer is provided. The semiconductor substrate includes a semiconductor portion, at least one first device, at least one second device and at least one first dummy ring. The at least one first device is disposed on a first region surrounded by the semiconductor portion. The at least one second device and the at least one first dummy ring are disposed on a second region, and the second region surrounds the first region. The at least one patterned dielectric layer covers the semiconductor substrate.

20 Claims, 13 Drawing Sheets

Related U.S. Application Data division of application No. 16/022,702, filed on Jun. 29, 2018, now Pat. No. 11,211,388.

(60) Provisional application No. 62/586,116, filed on Nov. 14, 2017.

(51) Int. Cl.
| | |
|---|---|
| *H01L 21/762* | (2006.01) |
| *H01L 21/765* | (2006.01) |
| *H01L 23/00* | (2006.01) |
| *H01L 29/40* | (2006.01) |
| *H01L 29/66* | (2006.01) |
| *H10B 20/00* | (2023.01) |
| *H10B 41/35* | (2023.01) |
| *H10B 41/43* | (2023.01) |
| *H10B 41/49* | (2023.01) |

(52) U.S. Cl.
CPC ........ *H01L 23/562* (2013.01); *H01L 29/0649* (2013.01); *H01L 29/40114* (2019.08); *H01L 29/404* (2013.01); *H01L 29/66825* (2013.01); *H10B 41/35* (2023.02); *H10B 41/43* (2023.02); *H10B 41/49* (2023.02)

(58) Field of Classification Search
USPC ........................................ 257/127, 409, 484
See application file for complete search history.

(56) References Cited

U.S. PATENT DOCUMENTS

| | | |
|---|---|---|
| 2006/0226469 A1 | 10/2006 | Nakagawa |
| 2009/0001515 A1 | 1/2009 | Yamagata |
| 2012/0270379 A1 | 10/2012 | Lai et al. |
| 2013/0062777 A1 | 3/2013 | Ogata |
| 2013/0256769 A1 | 10/2013 | Jeong et al. |
| 2016/0079348 A1* | 3/2016 | Iwatsu ................ H01L 29/0623 257/141 |
| 2016/0181268 A1 | 6/2016 | Chuang et al. |
| 2016/0307909 A1 | 10/2016 | Tseng et al. |

FOREIGN PATENT DOCUMENTS

| | | |
|---|---|---|
| KR | 100816732 B1 | 3/2008 |
| KR | 20080090851 A | 10/2008 |
| KR | 20090078090 A | 7/2009 |

OTHER PUBLICATIONS

Notice of Allowance dated Aug. 24, 2021 for U.S. Appl. No. 16/022,702.

Notice of Allowance dated Mar. 8, 2023 for U.S. Appl. No. 17/555,828.

\* cited by examiner

ARRAY BOUNDARY STRUCTURE TO REDUCE DISHING

REFERENCE TO RELATED APPLICATIONS

This Application is a Continuation of U.S. application Ser. No. 17/555,828, filed on Dec. 20, 2021, which is a Divisional of U.S. application Ser. No. 16/022,702, filed on Jun. 29, 2018 (now U.S. Pat. No. 11,211,388, issued on Dec. 28, 2021), which claims the benefit of U.S. Provisional Application No. 62/586,116, filed on Nov. 14, 2017. The contents of the above-referenced Patent Applications are hereby incorporated by reference in their entirety.

BACKGROUND

Fabrication of Non-Volatile Memory (NVM) cell array has been integrated in advanced Complementary Metal Oxide Semiconductor (CMOS) process for smart card and automotive applications. The gate height of the embedded NVM cell array is usually higher than that of periphery circuit, such as logic devices. The gate height difference between the embedded NVM cell array and the logic devices results in dishing issue during the successive Chemical Mechanical Polishing (CMP) processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
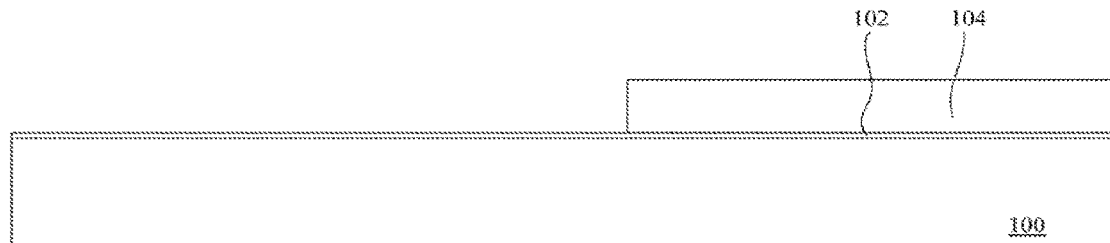
FIG. 1 through FIG. 32 are cross-sectional views schematically illustrating a method of fabricating a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 32 are cross-sectional views schematically illustrating a method of fabricating a semiconductor structure according to some embodiments of the present disclosure.

Figure 33:
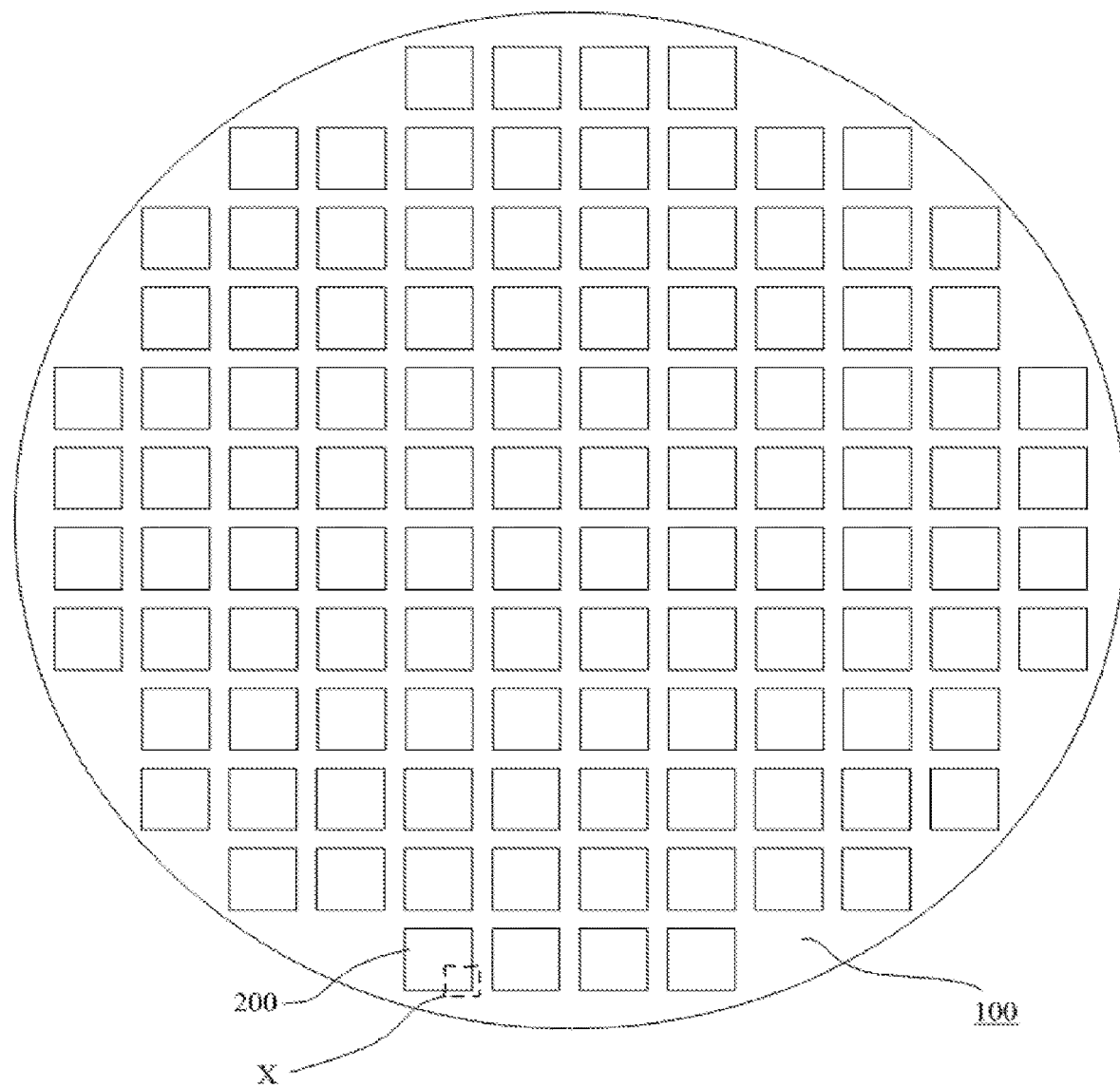
FIG. 33 is a top view schematically illustrating a wafer including a plurality of integrated circuit components arranged in array according to some embodiments of the present disclosure.

Referring to FIG. 1, a semiconductor substrate 100 is provided. For example, the semiconductor substrate 100 may be a silicon substrate or a substrate made of other semiconductor materials. In some embodiments, the semiconductor substrate 100 may be a semiconductor wafer (e.g., silicon wafer or the like) as shown in FIG. 33. A pad layer 102 is formed on the semiconductor substrate 100 and a patterned hard mask layer 104 is formed on the pad layer 102. For example, the pad layer 102 may be a silicon oxide ($SiO_x$, x>0) layer and the patterned hard mask layer 104 may be a silicon nitride ($SiN_y$, y>0) layer. The materials of the pad layer 102 and the patterned hard mask layer 104 are merely for illustration and the disclosure is not limited thereto. As shown in FIG. 1, the patterned hard mask layer 104 may be formed by, for example, a photolithography and etching process, and a portion of the pad layer 102 is exposed by the patterned hard mask layer 104. The pad layer 102 may function as an etching stop layer during the etching process of the patterned hard mask layer 104.

Figure 2:
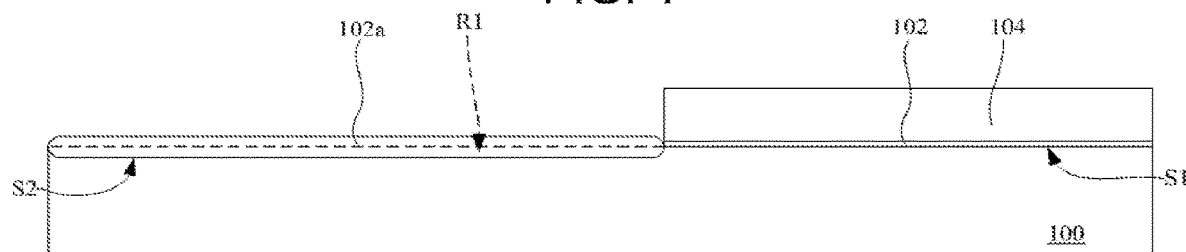

Referring to FIG. 1 and FIG. 2, a wet oxidation process is performed such that a portion of the semiconductor substrate 100 covered by the pad layer 102 is oxidized and a wet oxide layer 102a is formed on the semiconductor substrate 100. After the wet oxidation process is performed, a recess R1 of the semiconductor substrate 100 is formed and the wet oxide layer 102a is formed on the recess R1. As shown in FIG. 1 and FIG. 2, the wet oxide layer 102a is not covered by the patterned hard mask layer 104 and the wet oxide layer 102a is thicker than the pad layer 102 covered by the patterned hard mask layer 104. For example, the thickness of the wet oxide layer 102a ranges from about 100 angstroms to about 2000 angstroms and the depth of the recess R1 of the semiconductor substrate 100 is about half of the thickness of the wet oxide layer 102a (e.g., about 50 angstroms to about 1000 angstroms). In some embodiments, the thickness of the wet oxide layer 102a may be about 600 angstroms and the depth of the recess R1 of the semiconductor substrate 100 may be about half of the thickness of the wet oxide layer 102a (e.g., about 300 angstroms). The thickness of the wet oxide layer 102a and the depth of the recess R1 are merely for illustration and the disclosure is not limited thereto.

Figure 3:
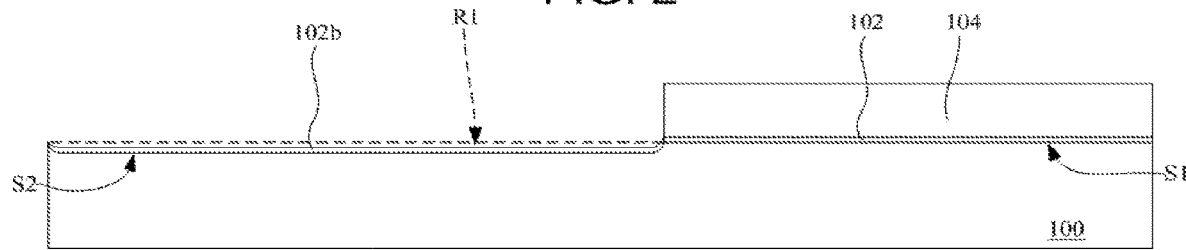

Referring to FIG. 2 and FIG. 3, the wet oxide layer 102a is partially removed by an etching process to form another pad layer 102b in the recess R1. The pad layer 102b in the recess R1 is connected to the pad layer 102 covered by the patterned hard mask layer 104. In some embodiments, the pad layer 102b and the pad layer 102 may be substantially identical in thickness (e.g., about 10 angstroms to about 500 angstroms). During the etching process for forming the pad layer 102b, the patterned hard mask layer 104 may be slightly etched and the thickness loss of the patterned hard mask layer 104 may be about 80 angstroms, for example. The above-mentioned the thickness loss and the thicknesses of the pad layer 102b and the pad layer 102 are merely for illustration and the disclosure is not limited thereto.

As shown in FIG. 2 and FIG. 3, the semiconductor substrate 100 may provide two surfaces S1 and S2, wherein the surface S1 and the surface S2 are located at different level heights and the level height difference between the surface S1 and the surface S2 ranges from about 50 angstroms to about 1000 angstroms, for example. The above-mentioned level height difference between the surface S1 and the surface S2 is merely for illustration and the disclosure is not limited thereto.

Figure 4:
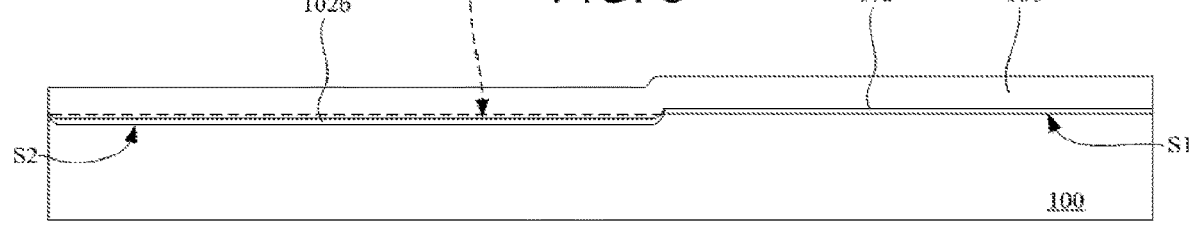

Referring to FIG. 4, a hard mask layer 106 is formed on the pad layer 102 on the surface S1 of the semiconductor substrate 100 and the pad layer 102b on the surface S2 of the semiconductor substrate 100. For example, the hard mask layer 106 may be a silicon nitride layer. The material of the hard mask layer 106 is merely for illustration and the disclosure is not limited thereto.

Figure 5:
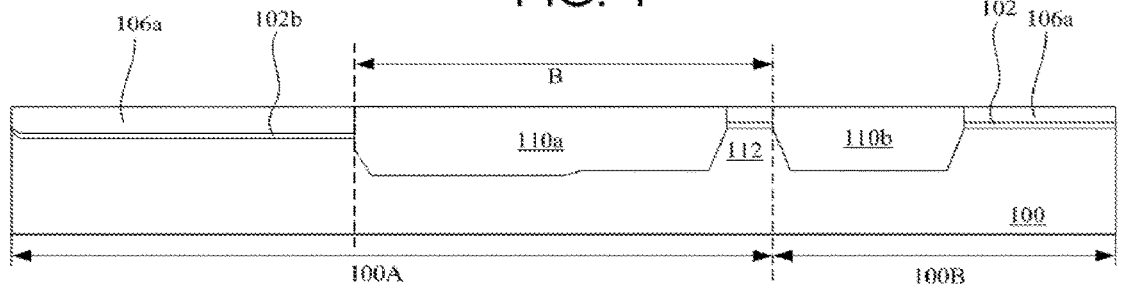
Figure 34:
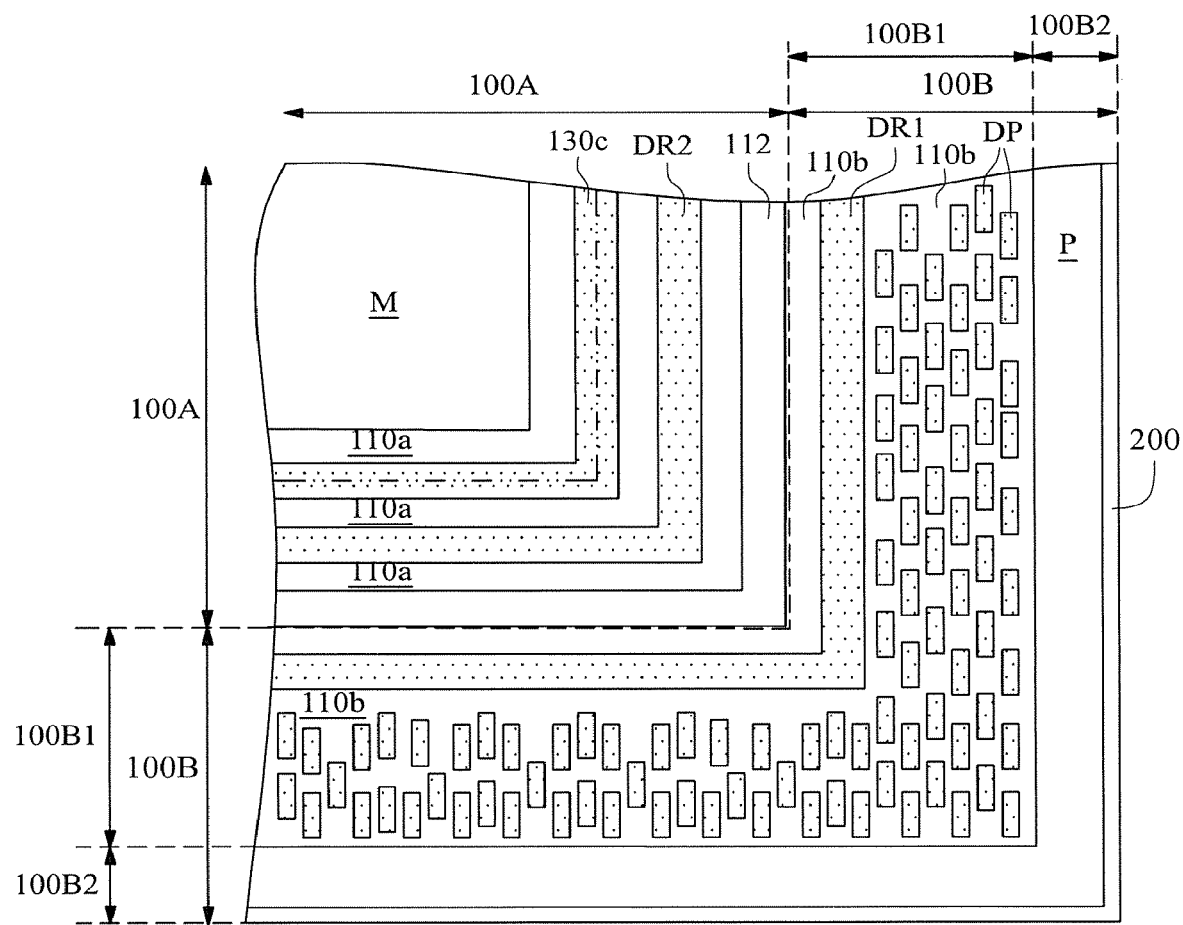
FIG. 34 is an enlarged top view schematically illustrating the portion X shown in FIG. 33 according to some embodiments of the present disclosure.
Figure 35:
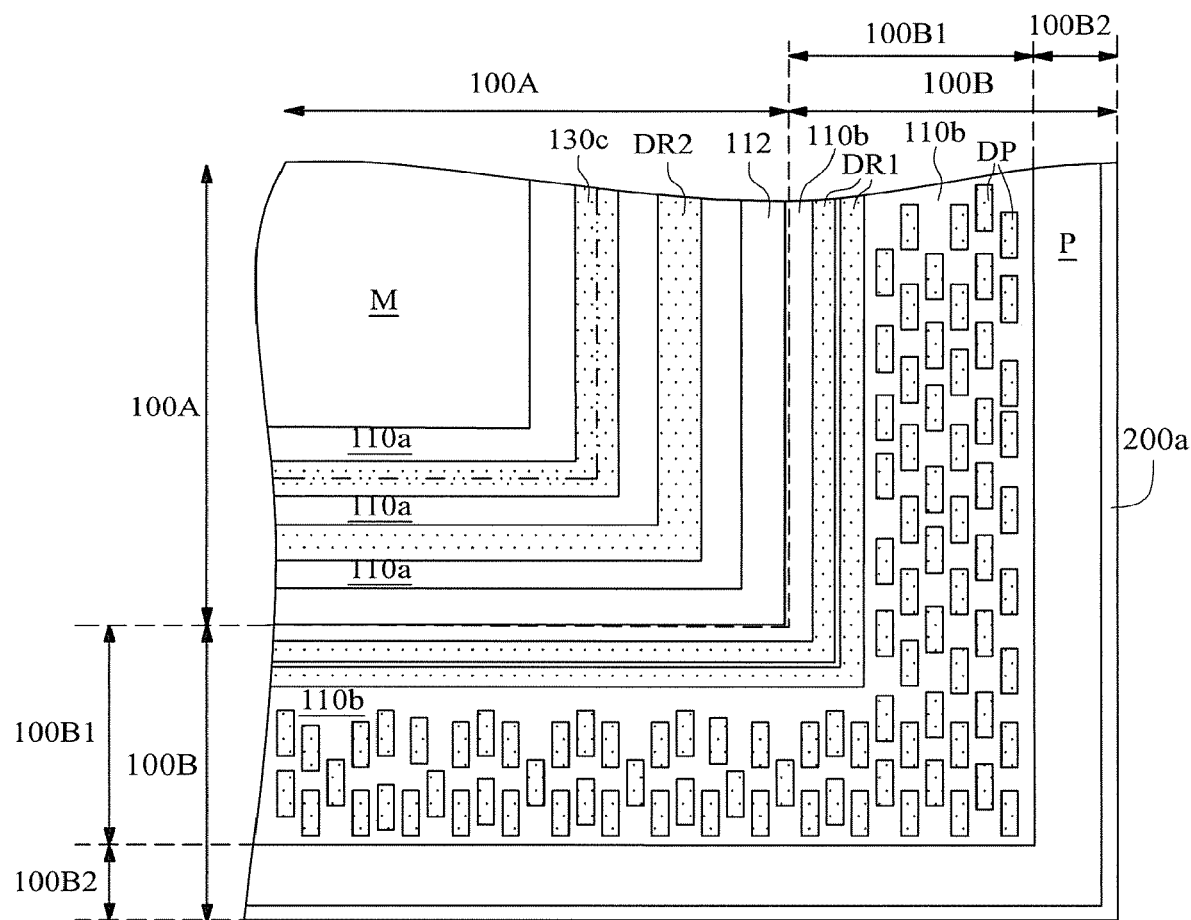
FIG. 35 is an enlarged top view schematically illustrating the portion X shown in FIG. 33 according to some alternative embodiments of the present disclosure.

Referring to FIG. 5, a trench isolation fabrication process may be performed on the semiconductor substrate 100 such that at least one first trench isolation 110a (e.g., at least one inner trench isolation) and at least one second trench isolation 110b (e.g., at least one outer trench isolation) are formed in the semiconductor substrate 100. After the at least one first trench isolation 110a and the at least one second trench isolation 110b are formed, a semiconductor portion 112, a first region 100A and a second region 100B of the semiconductor substrate 100 are defined. In some embodiments, the first region 100A may be an active region surrounded by the at least one first trench isolation 110a, the second region 100B may be a periphery region. For example, the first region 100A is connected to the second region 100B, the second region 100B is a ring-shaped periphery region, and the first region 100A is surrounded by the ring-shaped second region 100B, as illustrated in FIG. 34 and FIG. 35.

In some embodiments, the above-mentioned trench isolation fabrication process may include: patterning of the hard mask layer 106 to form a patterned hard mask layer 106a; forming a plurality of trenches in the semiconductor substrate 100 by, for example, an etching process; depositing of dielectric material to fill the trenches and cover the patterned hard mask layer 106a; and polishing (e.g., a CMP process) the dielectric material outside the trenches until the patterned hard mask layer 106a are exposed, as shown in FIG. 5. In some embodiments, the first trench isolation 110a and the second trench isolation 110b are, for example, shallow trench isolation (STI) structures. However, the fabrication process of the at least one first trench isolation 110a and the at least one second trench isolation 110b is not limited in this application.

As shown in FIG. 5, the semiconductor portion 112 of the semiconductor substrate 100 may be a ring-shaped structure which is in contact with the first trench isolation 110a and the second trench isolation 110b. The first trench isolation 110a and the second trench isolation 110b may locate at opposite sides of the semiconductor portion 112. The semiconductor portion 112 and the first trench isolation 110a may be located in a boundary region B of the first region 100A. In other words, the boundary region B is a region where the semiconductor portion 112 and the first trench isolation 110a are located. For example, the semiconductor portion 112 is in proximity to the interface between the first region 100A and the second region 100B while the second trench isolation 110b is in proximity to the interface (the dotted line shown in FIG. 5) between the first region 100A and the second region 100B. Furthermore, the top surfaces of the first trench isolation 110a, the second trench isolation 110b and the patterned hard mask layer 106a are substantially at the same level.

Figure 6:
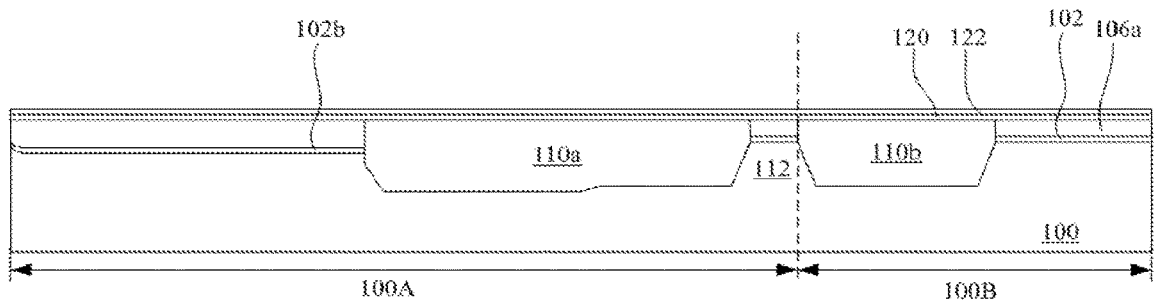

Referring to FIG. 6, a cap layer is formed on the top surfaces of the first trench isolation 110a, the second trench isolation 110b and the patterned hard mask layer 106a. In some embodiments, the cap layer may include a hard mask cap layer 120 and an oxide cap layer 122 formed on the hard mask cap layer 120. The hard mask cap layer 120 is formed on top surfaces of the first trench isolation 110a, the second trench isolation 110b and the patterned hard mask layer 106a. In some embodiments, the material of the oxide cap layer 122 may be different from that of the patterned hard mask layer 106a and the material of the oxide cap layer 122 may be the same as that of the pad layer 102. For example, the material of the hard mask cap layer 120 may include silicon nitride and the material of the oxide cap layer 122 may include silicon oxide. The above-mentioned materials of the hard mask cap layer 120 and the oxide cap layer 122 are merely for illustration and the disclosure is not limited thereto.

Figure 7:
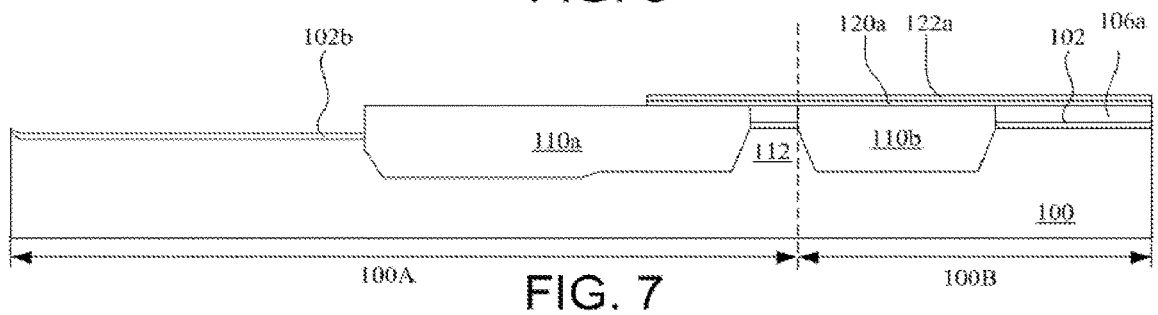

Referring to FIG. 7, the hard mask cap layer 120 and the oxide cap layer 122 are patterned by, for example, a photolithography and etching process so as to form a patterned cap layer including a patterned hard mask cap layer 120a and a patterned oxide cap layer 122a. The patterned hard mask cap layer 120a and the patterned oxide cap layer 122a cover the second trench isolation 110b, the patterned hard mask layer 106a between the first trench isolation 110a and the second trench isolation 110b, and a portion of the first trench isolation 110a which is in proximity to the semiconductor portion 112.

By utilizing the patterned hard mask cap layer 120a and the patterned oxide cap layer 122a as a mask, a portion of the patterned hard mask layer 106a which is disposed on the pad layer 102b is removed by, for example, an etching process until the pad layer 102b is exposed. In some embodiments, during the etching process for partially removing the patterned hard mask layer 106a, since the material of the patterned oxide cap layer 122a (e.g., silicon oxide) is different from that of the patterned hard mask layer 106a and the patterned hard mask cap layer 120a (e.g., silicon nitride), the patterned hard mask layer 106a may be selectively etched. Furthermore, during the etching process for partially removing the patterned hard mask layer 106a, since the material of the patterned oxide cap layer 122a (e.g., silicon oxide) is the same as that of the pad layer 102b, the pad layer 102b may serve as an etching stop layer. The above-mentioned materials of the pad layer 102b, the patterned hard mask layer 106a, the patterned hard mask cap layer 120a and the patterned oxide cap layer 122a are merely for illustration and the disclosure is not limited thereto.

Figure 8:
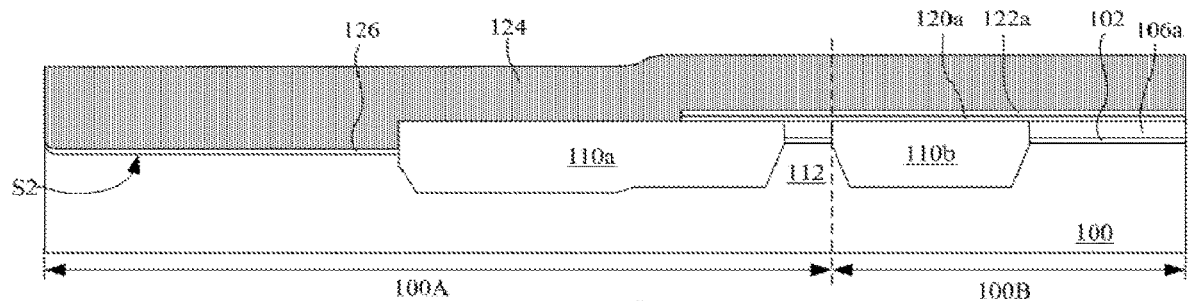

Referring to FIG. 7 and FIG. 8, the pad layer 102b is removed and a dielectric layer 126 is formed on the surface S2 of the semiconductor substrate 100. In some embodiments, the dielectric layer 126 may be a silicon oxide layer.

Then, a conductive layer 124 is formed on the patterned oxide cap layer 122a, the first trench isolation 110a and the dielectric layer 126. In some embodiments, the conductive layer 124 may be a doped polysilicon layer. For example, the conductive layer 124 may be formed by depositing a polysilicon layer, implanting the polysilicon layer with dopants, and annealing the doped polysilicon layer. The above-mentioned materials of the conductive layer 124 and the dielectric layer 126 are merely for illustration and the disclosure is not limited thereto.

Figure 9:
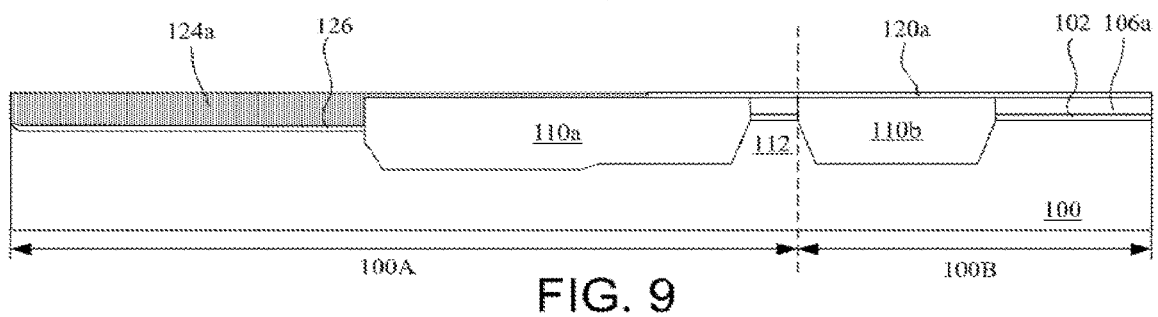

Referring to FIG. 8 and FIG. 9, a polishing process (e.g., a CMP process) is performed on the conductive layer 124 such that a conductive layer 124a having a planarized top surface is formed. The conductive layer 124a covers the dielectric layer 126 and the first trench isolation 110a. During the polishing process of the conductive layer 124, the patterned oxide cap layer 122a is polished until the patterned hard mask cap layer 120a is exposed. The patterned hard mask cap layer 120a may serve as a polishing stop layer during the polishing process of the conductive layer 124. As shown in FIG. 9, the top surfaces of the patterned hard mask cap layer 120a and conductive layer 124a are substantially at the same level.

Figure 10:
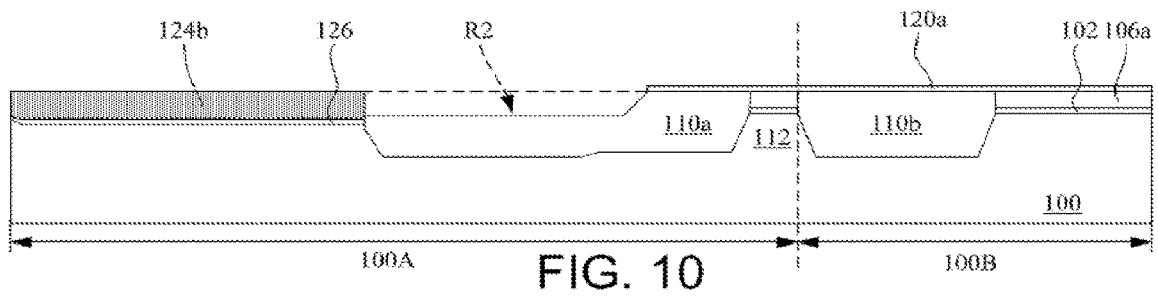

Referring to FIG. 9 and FIG. 10, the conductive layer 124a is further patterned by, for example, an etching process such that at least one conductive pattern 124b is formed on the dielectric layer 126. During the etching process of the conductive layer 124a, a portion of the first trench isolation 110a which is not covered by the patterned hard mask cap layer 120a may be partially removed. As shown in FIG. 10, a recess R2 is formed in the first trench isolation 110a and the recess R2 is in proximity to the conductive pattern 124b, for example.

Figure 11:
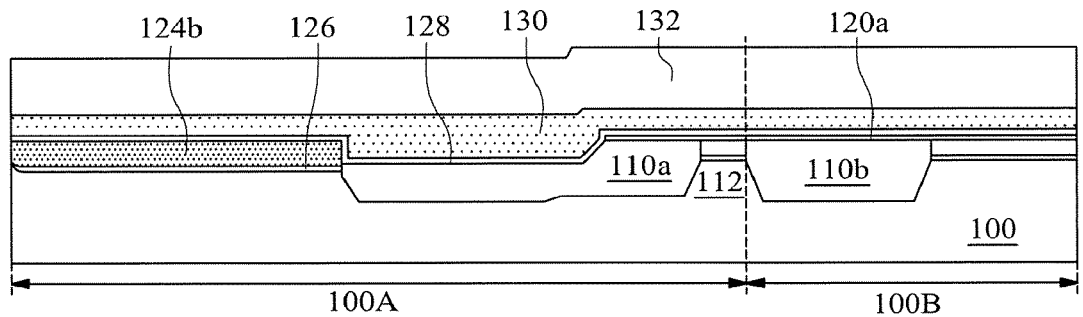

Referring to FIG. 10 and FIG. 11, a dielectric layer 128, a conductive layer 130 and a hard mask layer 132 are sequentially formed so as to cover the conductive pattern 124b, the first trench isolation 110a and the patterned hard mask cap layer 120a. The dielectric layer 128 covers the conductive pattern 124b, the first trench isolation 110a and the patterned hard mask cap layer 120a. The conductive layer 130 covers the dielectric layer 128. The hard mask layer 132 covers the conductive layer 130. In some embodiments, the dielectric layer 128 may be a silicon oxide layer. The conductive layer 130 may be a doped polysilicon layer. For example, the conductive layer 130 may be formed by depositing a polysilicon layer, implanting the polysilicon layer with dopants, and annealing the doped polysilicon layer. The hard mask layer 132 may be a silicon oxide/silicon nitride/silicon oxide stacked layer. However, the configuration of the hard mask layer 132 is not limited. The above-mentioned materials of the dielectric layer 128, the conductive layer 130 and the hard mask layer 132 are merely for illustration and the disclosure is not limited thereto.

Figure 12:
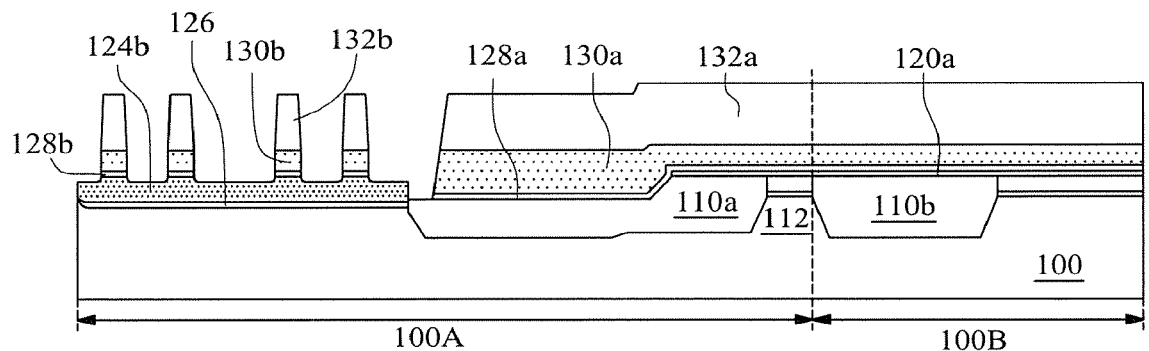

Referring to FIG. 11 and FIG. 12, the dielectric layer 128, the conductive layer 130 and the hard mask layer 132 are patterned, for example, by a photolithography and etching process such that a patterned dielectric layer 128a, dielectric patterns 128b, a patterned conductive layer 130a, control gate electrodes 130b, a patterned hard mask layer 132a and hard mask patterns 132b are formed. The patterned dielectric layer 128a, the patterned conductive layer 130a and the patterned hard mask layer 132a are formed to cover the first trench isolation 110a and the patterned hard mask cap layer 120a. The dielectric patterns 128b, the control gate electrodes 130b and hard mask patterns 132b are formed to partially cover the conductive pattern 124b. During the patterning process of the dielectric layer 128, the conductive layer 130 and the hard mask layer 132, the conductive pattern 124b may be slightly over-etched.

Figure 13:
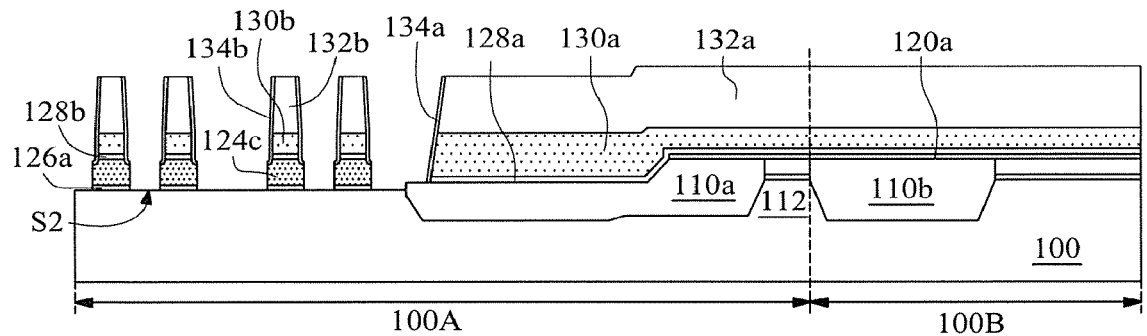

Referring to FIG. 12 and FIG. 13, spacers 134a and 134b are formed. The spacer 134a is formed on sidewalls of the patterned dielectric layer 128a, the patterned conductive layer 130a and the patterned hard mask layer 132a. The spacers 134b are formed on sidewalls of the dielectric patterns 128b, the control gate electrodes 130b and hard mask patterns 132b.

After forming the spacers 134a and 134b, a patterning process (e.g., an etching process) is performed to remove portions of the conductive pattern 124b and portion of the dielectric layer 126 which are not covered by the spacers 134a and 134b such that a plurality of floating gate electrodes 124c and a plurality of dielectric patterns 126a are formed on the surface S2 of the semiconductor substrate 100. The floating gate electrodes 124c and the dielectric patterns 126a are self-aligned with the dielectric patterns 128b, the control gate electrodes 130b and the hard mask patterns 132b. Since the conductive pattern 124b is slightly over-etched, the bottom portion of each spacer 134b may extend laterally on the conductive pattern 124b and the bottom portions of the spacers 134b may be in contact with the floating gate electrodes 124c.

Figure 14:
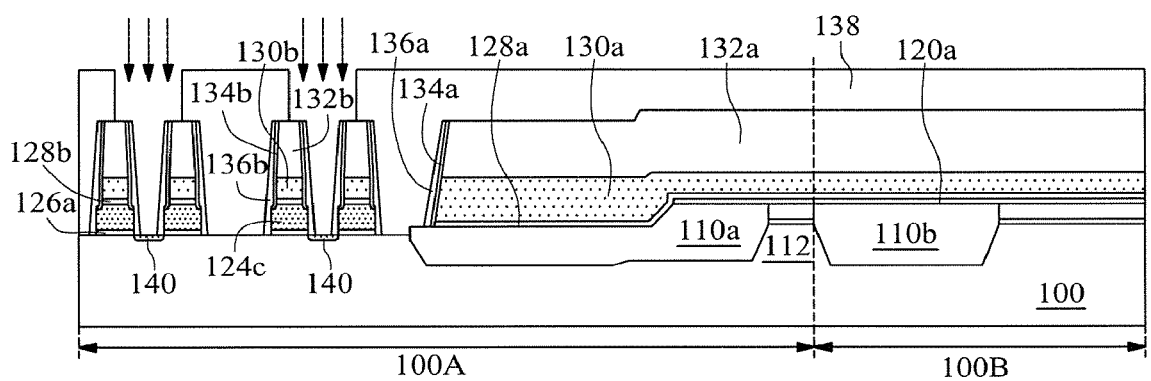

Referring to FIG. 13 and FIG. 14, after forming the floating gate electrodes 124c and the dielectric patterns 126a, a plurality of spacers 136a and 136b are formed. The spacer 136a is formed on the spacer 134a while the spacers 136b are formed on the spacers 134b. Further, the spacers 136b cover sidewalls of the floating gate electrodes 124c and sidewalls of the dielectric patterns 126a. Then, a patterned photoresist layer 138 is formed and an ion implantation process is performed such that a plurality of doped regions 140 (e.g., common source regions) are formed in the semiconductor substrate 100. In some embodiments, an annealing process may be further performed to anneal the doped regions 140 in the semiconductor substrate 100 such that the implanted ion or dopant may diffuse.

Figure 15:
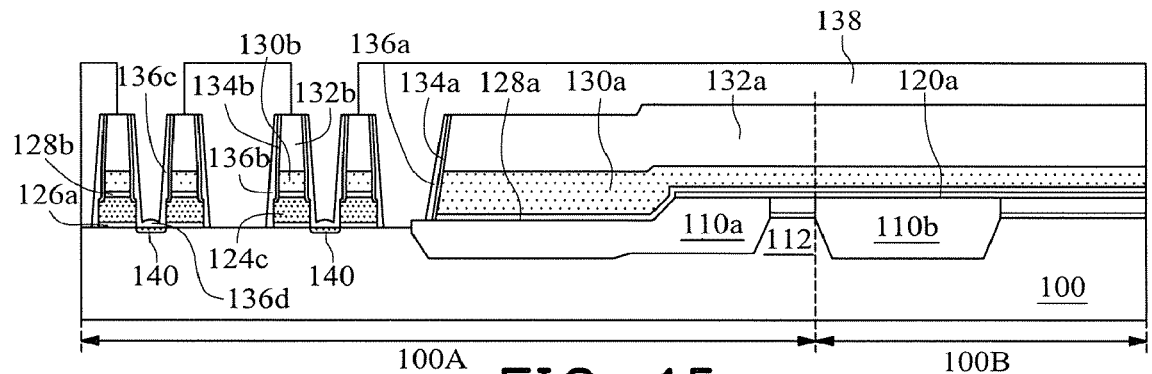

Referring to FIG. 14 and FIG. 15, after forming the doped regions 140 in the semiconductor substrate 100, the spacers 136b revealed by openings of the patterned photoresist layer 138 are removed until the spacers 134b, the sidewalls of the floating gate electrodes 124c and the sidewalls of the dielectric patterns 126a are exposed by the openings of the patterned photoresist layer 138. Then, a plurality of dielectric layers 136c are formed in the openings of the patterned photoresist layer 138 to cover the spacers 134b, the sidewalls of the floating gate electrodes 124c and the sidewalls of the dielectric patterns 126a and a plurality of oxidation layers 136d (e.g., common source oxidation layers, CSOX) are formed to cover the doped regions 140 formed in the semiconductor substrate 100.

In some embodiments, to prevent the contamination resulted from the patterned photoresist layer 138, the patterned photoresist layer 138 is removed before forming the dielectric layers 136c and the oxidation layers 136d. In some embodiments, the patterned photoresist layer 138 may be removed by, for example, an ashing process or other suitable processes.

Figure 16:
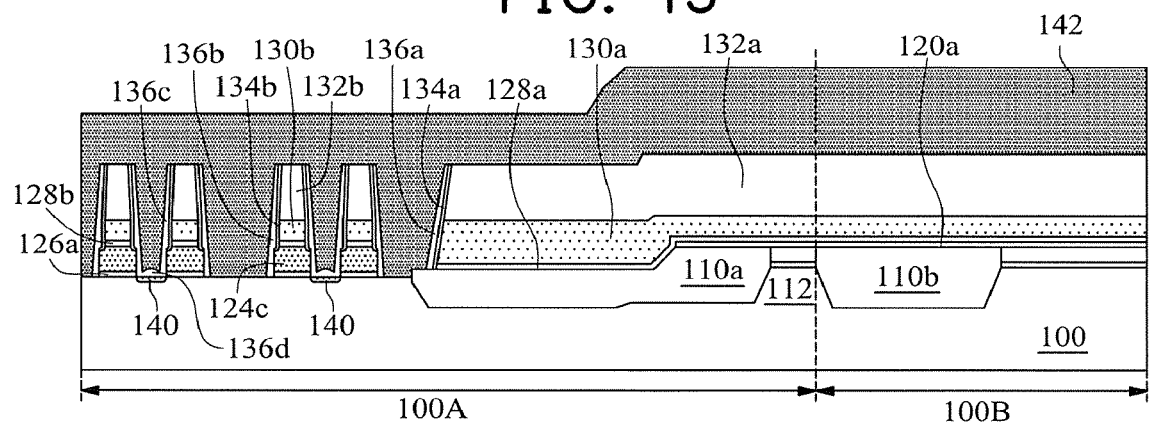
Figure 17:
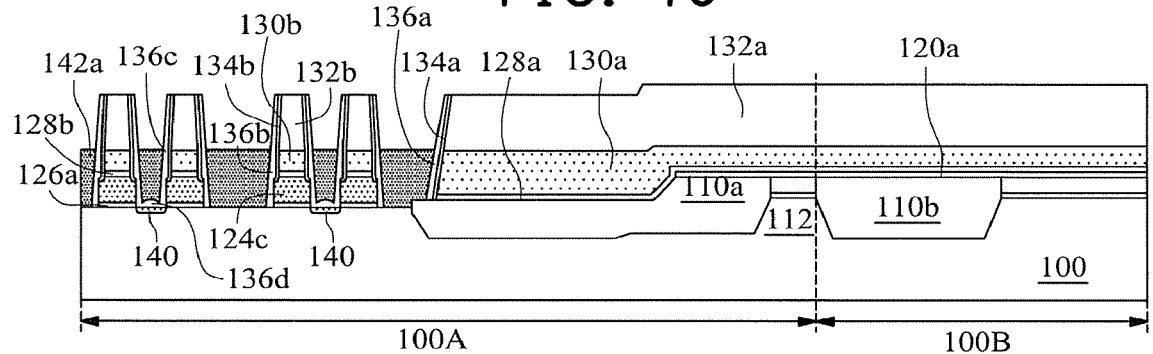

Referring to FIG. 16 and FIG. 17, a gate dielectric layer (not shown) and a conductive layer 142 are sequentially formed on the semiconductor substrate 100. In some embodiments, the conductive layer 142 may be a doped polysilicon layer. For example, the conductive layer 142 may be formed by depositing a polysilicon layer, implanting the polysilicon layer with dopants, and annealing the doped polysilicon layer. The above-mentioned material of the conductive layer 142 is merely for illustration and the disclosure is not limited thereto. Then, a polishing process (e.g., a CMP process) and an etching back process are sequentially performed on the conductive layer 142 such that a plurality of conductive patterns 142a having planarized top surfaces are formed. In some embodiments, the conductive layer 142 may be polished until the patterned hard mask layer 132a is exposed and the polished conductive layer 142 may be etched back so as to form the conductive patterns 142a.

Figure 18:
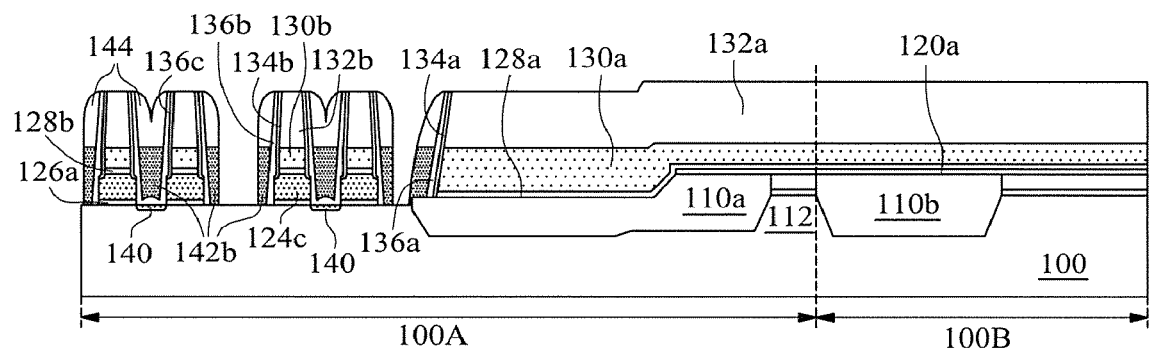

Referring to FIG. 17 and FIG. 18, after the conductive patterns 142a are formed, a plurality of spacers 144 are formed on the conductive patterns 142a so as to cover the spacers 136a, the spacers 136b and the dielectric layers 136c. Then, the conductive patterns 142a and the gate dielectric layer are patterned by, for example, an etching back process such that a plurality of select gate electrodes 142b (e.g., erase gate electrodes above the doped regions 140 and/or word lines) and a plurality of select gate oxide layers (SGOX) under the select gate electrodes 142b are formed. In other words, the conductive patterns 142a and the gate dielectric layer which are not covered by the plurality of spacers 144 are partially etched so as to form the plurality of select gate electrodes 142b.

Figure 19:
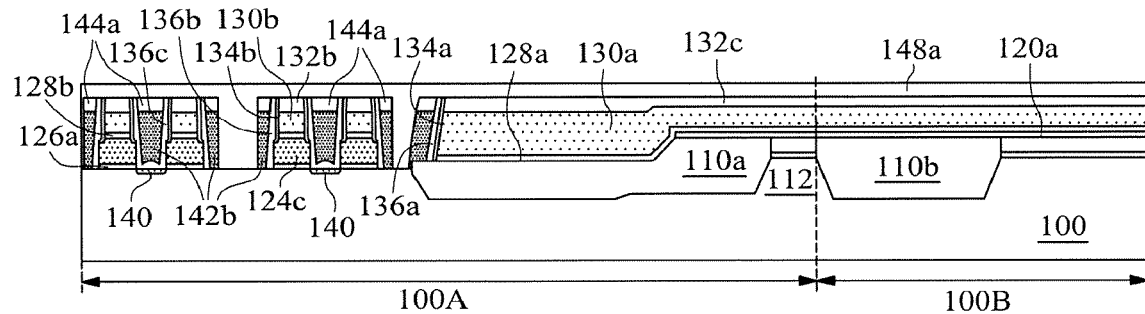

Referring to FIG. 18 and FIG. 19, a polishing process (e.g., a CMP process) of the spacers 144 and the patterned hard mask layer 132a is performed such that a plurality of spacers 144a and a patterned hard mask layer 132c having reduced height are formed. During the polishing process of the spacers 144 and the patterned hard mask layer 132a, portions of the spacer 134a, the spacers 134b, the spacer 136a, the spacers 136b and the dielectric layers 136c are polished. In some embodiments, before performing the polishing process of the spacers 144 and the patterned hard mask layer 132a, a bottom layer (not shown) used for polishing process may be coated to cover the structures on the semiconductor substrate 100 prior to the polishing of the spacers 144 and the patterned hard mask layer 132a. And, the bottom layer (not shown) may be removed after the polishing of the spacers 144 and the patterned hard mask layer 132a. After performing the polishing process of the spacers 144 and the patterned hard mask layer 132a, a dummy layer 148a may be formed to cover the first region 100A and the second region 100B of the semiconductor substrate 100. In some embodiments, the dummy layer 148a may include a liner oxide layer and the dummy polysilicon layer stacked on the liner oxide layer. The dummy layer 148a may be formed by sequentially depositing the liner oxide layer and a polysilicon layer and etching back the polysilicon layer to form the dummy polysilicon layer on the liner oxide layer. The material and configuration of the dummy layer 148a is merely for illustration and the disclosure is not limited thereto.

Figure 20:
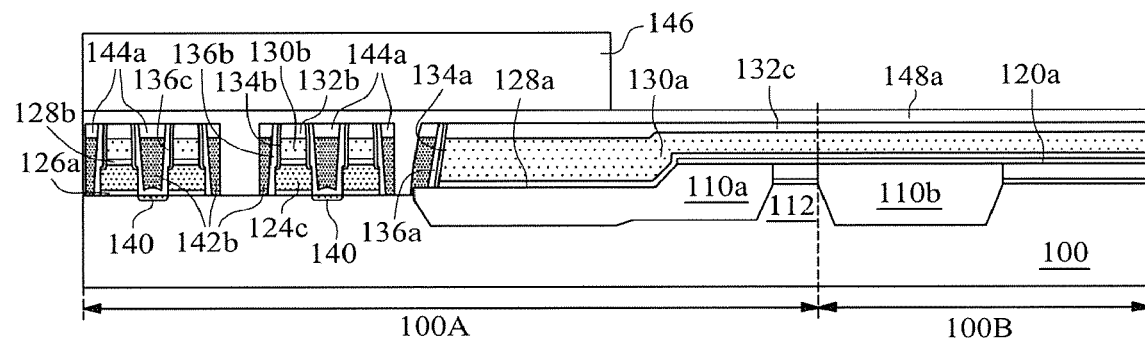
Figure 21:
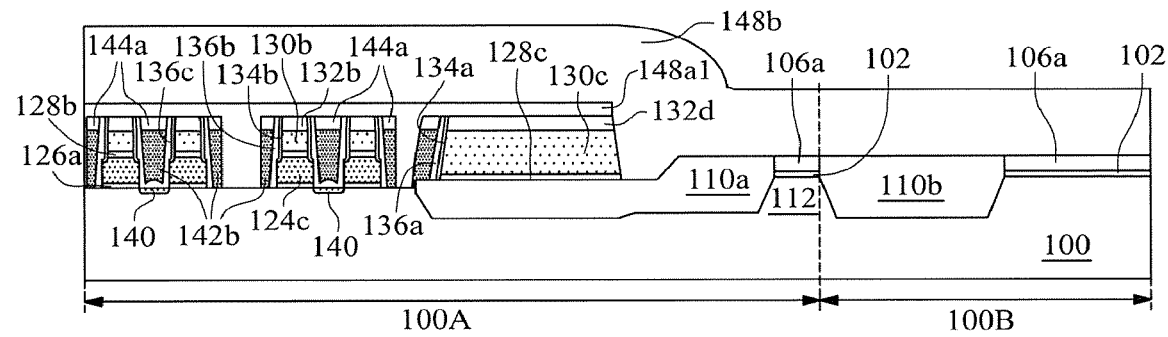

Referring to FIG. 20 and FIG. 21, a patterned photoresist layer 146 is formed to cover a portion of the dummy layer 148a. Then, the dummy layer 148a, the patterned dielectric layer 128a, the patterned conductive layer 130a and the patterned hard mask layer 132c are patterned by, for example, a photolithography and etching process such that a dummy layer 148a1, a patterned dielectric layer 128c, a patterned conductive layer 130c and a patterned hard mask layer 132d are formed over the first region 100A of the semiconductor substrate 100. In some embodiments, the patterned conductive layer 130c and the patterned hard mask layer 132d may be ring-shaped structures. After the dummy layer 148a1, the patterned dielectric layer 128c, the patterned conductive layer 130c and the patterned hard mask layer 132d are formed, the patterned photoresist layer 146 may be removed by, for example, an ashing process or other suitable processes. After removing the patterned photoresist layer 146, a dummy layer 148b may be formed over the first region 100A and the second region 100B of the semiconductor substrate 100. In some embodiments, the dummy layer 148b may include a dummy polysilicon layer. The material and configuration of the dummy layer 148b are merely for illustration and the disclosure is not limited thereto.

Figure 22:
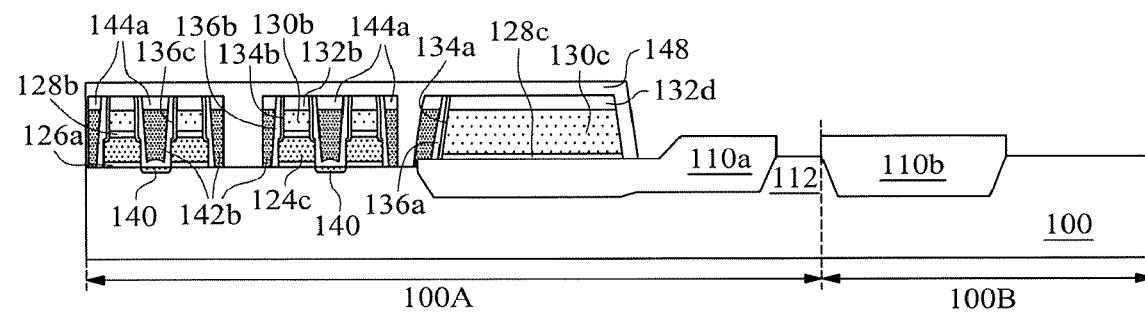

Referring to FIG. 21 and FIG. 22, after forming the dummy layer 148b, the dummy layer 148a1 and the dummy layer 148b are partially removed until the patterned hard mask layer 106a, the first trench isolation 110a and the second trench isolation 110b are revealed such that a patterned dummy layer 148 is formed. As shown in FIG. 22, the patterned hard mask layer 106a and the pad layer 102 which is not covered by the patterned dummy layer 148 is removed until the semiconductor portion 112 of the semiconductor substrate 100 is exposed.

Figure 23:
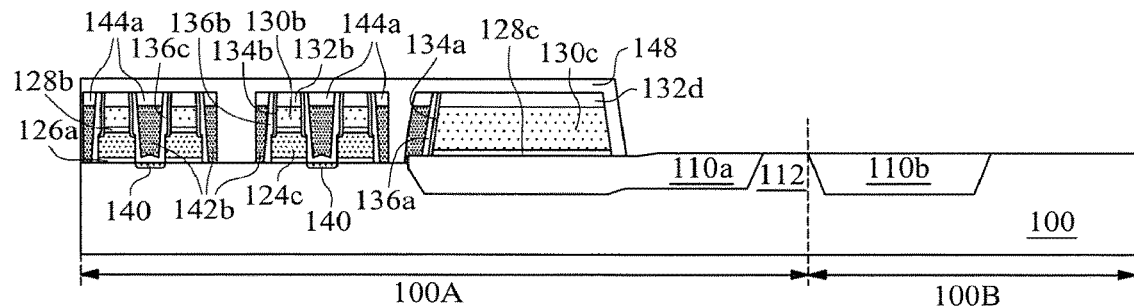

Referring to FIG. 22 and FIG. 23, after the removal of the patterned hard mask layer 106a and the pad layer 102, portions of the first trench isolation 110a and the second trench isolation 110b are revealed by the patterned dummy layer 148. The portions of the first trench isolation 110a and the second trench isolation 110b are partially removed and planarized such that top surfaces of the first trench isolation 110a, the second trench isolation 110b and the top surface of the semiconductor portion 112 are substantially at the same level. In some embodiments, the partial removal of the first trench isolation 110a and the second trench isolation 110b may be performed by, for example, an etching process.

Figure 24:
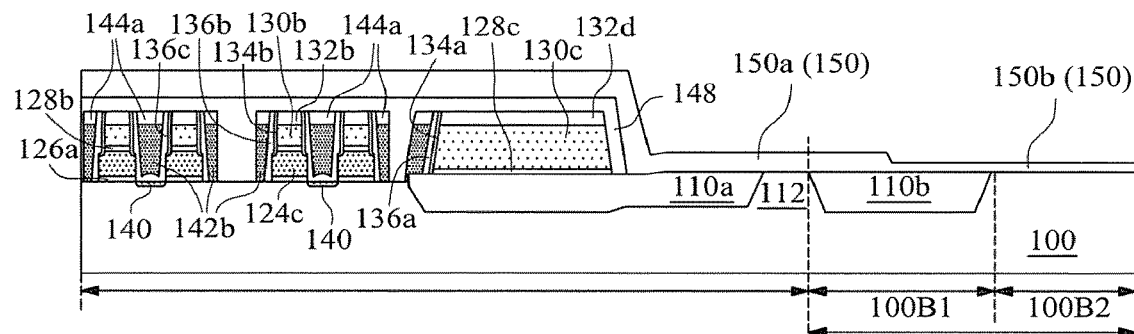

Referring to FIG. 23 and FIG. 24, a dielectric layer 150 is formed to cover the patterned dummy layer 148, the first trench isolation 110a, the second trench isolation 110b embedded in a dummy region 100B1 of the second region 100B, the semiconductor portion 112 and a periphery circuit region 100B2 of the second region 100B. The dummy region 100B1 is between the periphery circuit region 100B2 and the first region 100A. The dielectric layer 150 may include a first portion 150a and a second portion 150b. The first portion 150a not only covers the patterned dummy layer 148, the first trench isolation 110a and the semiconductor portion 112, but also partially covers the second trench isolation 110b. The second portion 150b not only partially covers the second trench isolation 110b, but also covers the dummy region 100B1. As shown in FIG. 24, a portion (e.g., the left portion) of the second trench isolation 110b is covered by the first portion 150a and another portion (e.g., the right portion) of the second trench isolation 110b is covered by second portion 150b. The first portion 150a is thicker than the second portion 150b and the thickness difference ranges from about 10 angstroms to about 500 angstroms, for example. The thickness difference between the first portion 150a and the second portion 150b is merely for illustration and the disclosure is not limited thereto.

Figure 36A:
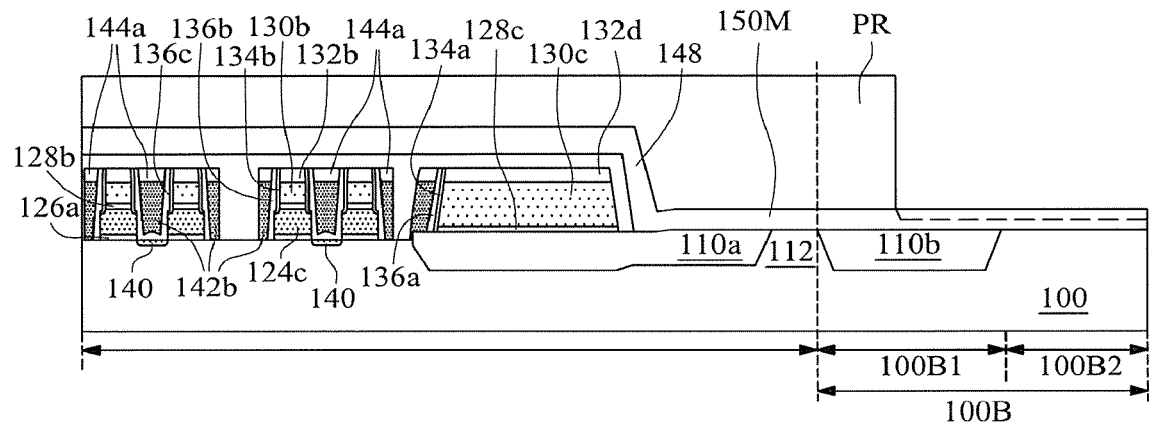
FIG. 36A and FIG. 36B are cross-sectional views schematically illustrating a method of fabricating a semiconductor structure according to some embodiments of the present disclosure.
Figure 36B:
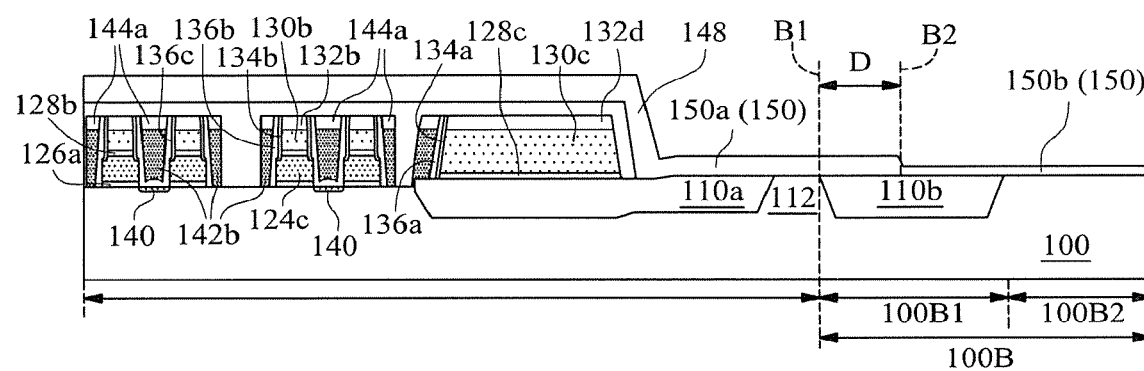

As illustrated in FIG. 36A and FIG. 36B, in some embodiments, the dielectric layer 150 including the first portion 150a and the second portion 150b may be formed by the following processes. First, a dielectric material layer 150M (as shown in FIG. 36A) is formed to cover the resulted structure shown in FIG. 23 by a deposition process (e.g., chemical vapor deposition or the like), and a patterned photoresist layer PR is formed on the dielectric material layer 150M by a photolithography process, for example. For example, the material of the dielectric material layer 150M include oxide, nitride, oxynitride, the combinations thereof or the like. By using the patterned photoresist layer PR as a mask, a portion of the dielectric material layer 150M which is not covered by the patterned photoresist layer PR may be removed by an etching process or other suitable patterning processes. After forming the dielectric layer 150, the patterned photoresist layer PR is removed. As shown in FIG. 36B, the distance D between the boundary B1 of first region 100A and the outer boundary B2 of the first portion 150a may range from about 0.1 micrometer to about 50 micrometers. When the distance D between the boundary B1 of the first region 100A and the outer boundary B2 of the first portion 150a is greater than about 0.1 micrometer, the space form forming the first dummy ring RD1 (shown in FIG. 29 through FIG. 32) is sufficient such that the first dummy ring RD1 (shown in FIG. 29 through FIG. 32) may have sufficient strength to retard expanding of CMP dishing.

Figure 37A:
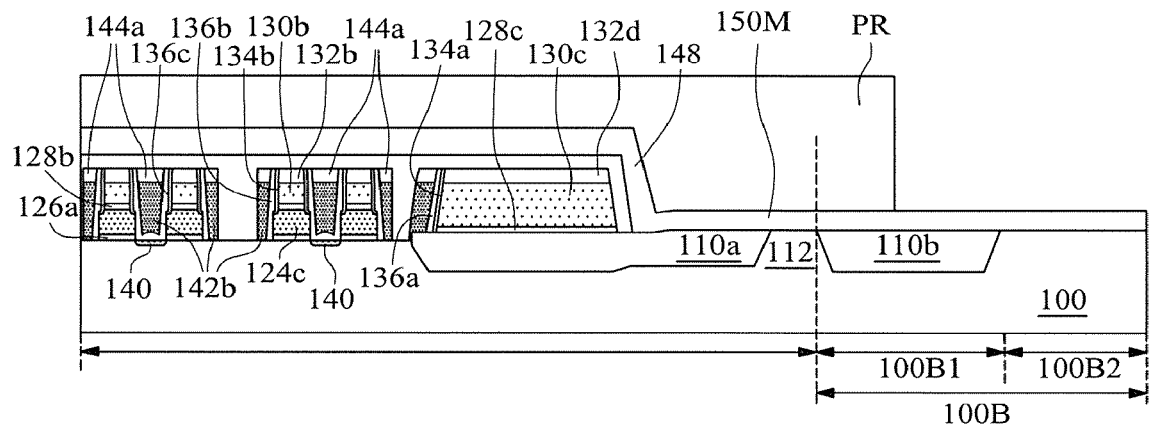
FIG. 37A through FIG. 37C are cross-sectional views schematically illustrating a method of fabricating a semiconductor structure according to some alternative embodiments of the present disclosure.
Figure 37B:
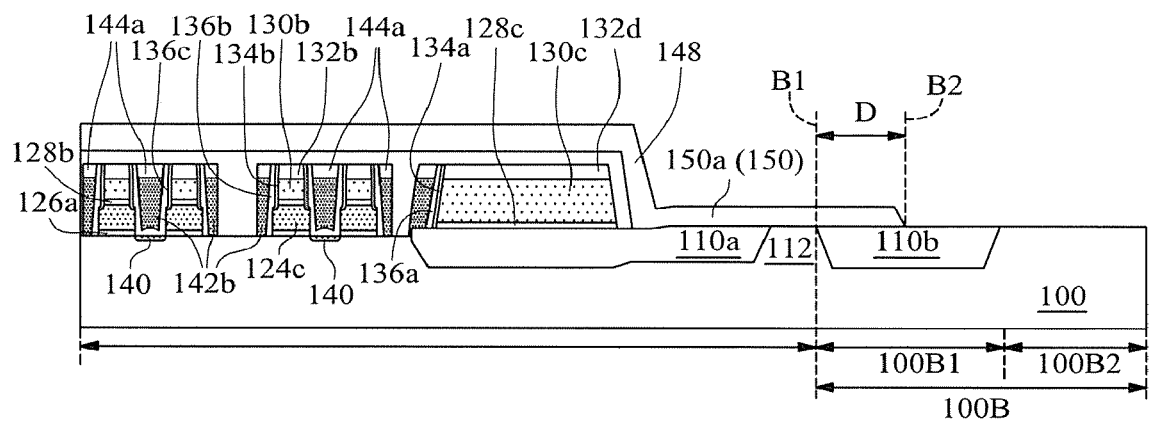
Figure 37C:
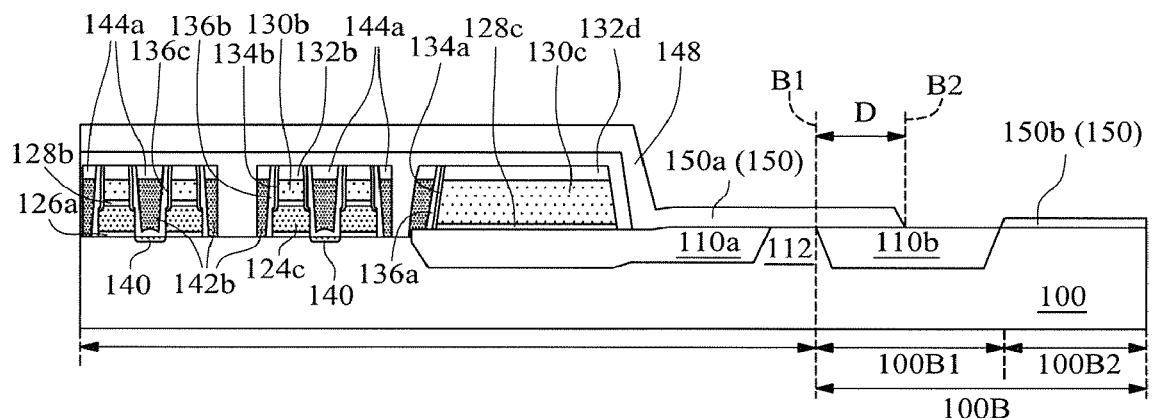

As illustrated in FIG. 37A and FIG. 37B, in some alternative embodiments, the dielectric layer 150 including the first portion 150a and the second portion 150b may be formed by the following processes. First, a dielectric material layer 150M (as shown in FIG. 36A) is formed to cover the resulted structure shown in FIG. 23 by a deposition process (e.g., chemical vapor deposition or the like), and a patterned photoresist layer PR is formed on the dielectric material layer 150M by a photolithography process, for example. By using the patterned photoresist layer PR as a mask, the dielectric material layer 150M which is not covered by the patterned photoresist layer PR may be removed by an etching process or other suitable patterning processes such that a portion (e.g., the left portion) of the second trench isolation 110b is covered by the first portion 150a and another portion (e.g., the right portion) of the second trench isolation 110b is revealed. After forming the first portion 150a, the second portion 150b may be formed only on the periphery circuit region 100B2 by a selective growth process (i.e. the second portion 150b does not cover the second trench isolation 110b). After forming the first portion 150a or after forming the second portion 150b, the patterned photoresist layer PR is removed. As shown in FIG. 37B and FIG. 37C, the distance D between the boundary B1 of first region 100A and the outer boundary B2 of first portion 150a may range from about 0.1 micrometer to about 50 micrometers. When the distance D between the boundary B1 of first region 100A and the outer boundary B2 of first portion 150a is greater than about 0.1 micrometer, the space form forming the first dummy ring RD1 (shown in FIG. 29 through FIG. 32) is sufficient such that the first dummy ring RD1 (shown in FIG. 29 through FIG. 32) may have sufficient strength to retard expanding of CMP dishing.

In some embodiments, the process illustrated in FIG. 37C is not used. In other words, the formation of the second portion 150b on the periphery circuit region 100B2 is not used in some embodiments.

Figure 25:
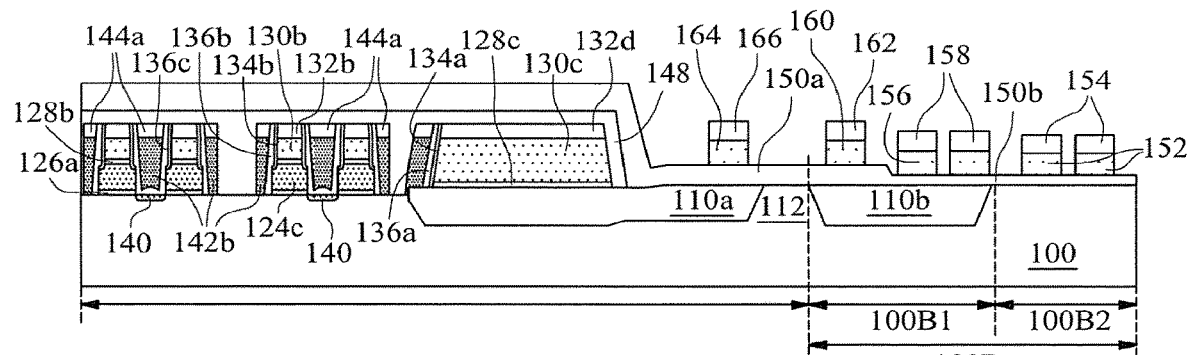

Referring to FIG. 24 and FIG. 25, after forming the dielectric layer 150, a plurality of gate electrodes 152 (e.g. polysilicon gate electrodes) and a plurality of dielectric caps 154 disposed on the gate electrodes 152 are formed on the periphery circuit region 100B2. The material of the gate electrodes 152 is merely for illustration and the disclosure is not limited thereto. In some embodiments, a plurality of dummy patterns 156, 158, 160, 162, 164 and 166 may be formed when forming the gate electrodes 152 and the dielectric caps 154. The material of the dummy patterns 156, 160 and 164 may be the same as that of the gate electrodes 152 while the material of the dummy patterns 158, 162 and 166 may be the same as that of the dielectric caps 154. The dummy patterns 156 and the dummy patterns 158 disposed on the dummy patterns 156 are formed on the second portion 150b and are located above the dummy region 100B1. The dummy pattern 160 and the dummy pattern 162 disposed on the dummy pattern 160 are formed on the first portion 150a and are located above the dummy region 100B1. The dummy pattern 164 and the dummy pattern 166 disposed on the dummy pattern 164 are formed on the first portion 150a and are located above the first region 100A. Due to the thickness difference between the first portion 150a and the second portion 150b, the top surfaces of the dummy patterns 162 and 166 are higher than the top surfaces of the dummy patterns 158 and the dielectric caps 154. For example, the dummy patterns 156 and 158 are dot-shaped dummy patterns while the dummy patterns 160, 162, 164 and 166 are ring-shaped dummy patterns. The dot-shaped dummy patterns 156 and 158 may be distributed above the second trench isolation 110b randomly (as shown in FIG. 34 and FIG. 35) or regularly.

In some embodiments, fabrication of the dummy patterns 164 and 166 may be omitted according to design requirements. In some alternative embodiments, fabrication of the dummy patterns 156 and 158 may be omitted according to design requirements. In some alternative embodiments, fabrication of the dummy patterns 156, 158, 164 and 166 may be omitted according to design requirements.

Figure 26:
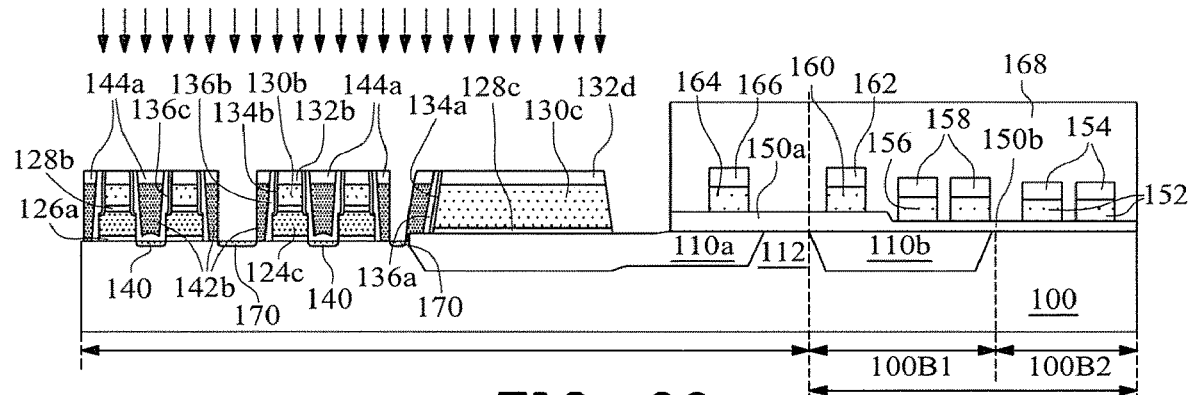

Referring to FIG. 25 and FIG. 26, after forming the gate electrodes 152, the dielectric caps 154, and the dummy patterns 156, 158, 160, 162, 164 and 166, a patterned photoresist layer 168 may be formed on the dielectric layer 150 such that the gate electrodes 152, the dielectric caps 154, and the dummy patterns 156, 158, 160, 162, 164 and 166 are covered by the patterned photoresist layer 168. For example, a photolithography and etching process is performed to pattern the dielectric layer 150 and to remove the patterned dummy layer 148. Then, an ion implantation process is performed such that a plurality of doped regions 170 (e.g., lightly doped drain regions) are formed in the semiconductor substrate 100. In some embodiments, an annealing process may be further performed to anneal the doped regions 170 in the semiconductor substrate 100 such that the implanted ion or dopant may diffuse.

In some embodiments, a plurality of lightly doped regions (e.g., lightly doped drain regions) which are not shown in FIG. 26 may be formed in the periphery circuit region 100B2 before or after forming the doped regions 170.

Figure 27:
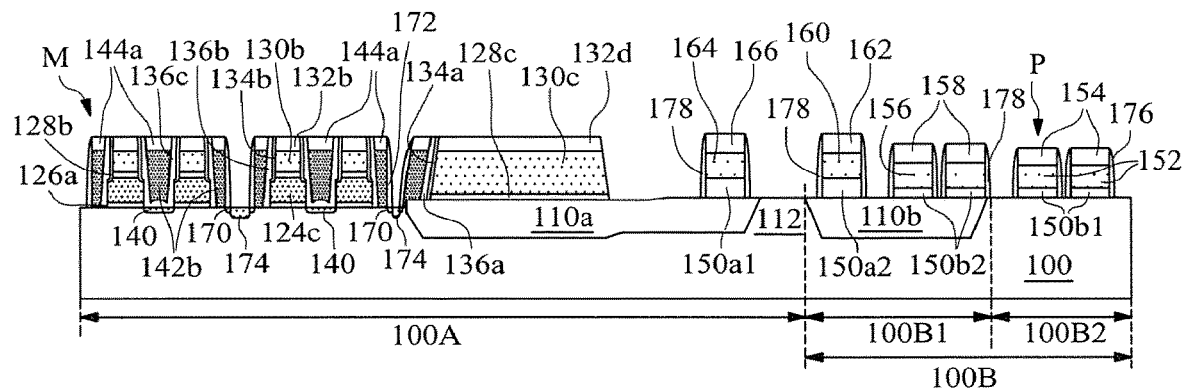

Referring to FIG. 27, After forming the doped regions 170, a plurality of spacers 172 are formed on the sidewalls of the select gate electrodes 142b and an ion implantation process is performed such that a plurality of doped regions 174 (e.g., drain regions) are formed in the semiconductor substrate 100. In some embodiments, an annealing process may be further performed to anneal the doped regions 174 in the semiconductor substrate 100 such that the implanted ion or dopant may diffuse. After the doped regions 174 are formed, a memory cell array M (namely, a first device) is formed. In some embodiments, the memory cell array M may include a plurality of memory cell arranged in array. The memory cell array M may be a non-volatile memory cell array, such as flash memory cell array or the like, for example. The type of the memory cell array M is merely for illustration and the disclosure is not limited thereto.

As shown in FIG. 27, the dielectric layer 150 is patterned to form a plurality of dielectric pattern 150a1, 150a2, 150b1 and 150b2. The dielectric pattern 150a1 is disposed between the first trench isolation 110a and the dummy pattern 164, the dielectric pattern 150a2 is disposed between the second trench isolation 110b and the dummy pattern 160, the dielectric patterns 150b1 are disposed between the semiconductor substrate 100 and the gate electrodes 152, and the dielectric patterns 150b2 are disposed between the second trench isolation 110b and the dummy patterns 156. For example, the material of the dielectric patterns 150a1, 150a2, 150b1 and 150b2 may include oxide, nitride, oxynitride, the combinations.

In some embodiments, a plurality of spacers 176 are formed on the sidewalls of the gate electrodes 152, the sidewalls of the dielectric caps 154 and the sidewalls of the dielectric patterns 150b1 while a plurality of spacers 178 are formed on the sidewalls of the dummy patterns 156, 158, 160, 162, 164 and 166 and the sidewalls of the dielectric patterns 150a1, 150a2 and 150b2. Furthermore, a plurality of doped regions (e.g., drain regions) which are not shown in FIG. 27 may be formed in the periphery circuit region 100B2 before or after forming the doped regions 174, such that a periphery circuit P (namely, a second device) may be formed on the periphery circuit region 100B2. The periphery circuit P may include a plurality of logic devices (e.g. MOS devices each including the dielectric patterns 150b1, the gate electrodes 152 and doped regions in the periphery circuit region 100B2). In some embodiments, the periphery circuit P may include core devices, static random access memory (SRAM) and input/output devices. The type of the periphery circuit P is merely for illustration and the disclosure is not limited thereto.

Figure 28:
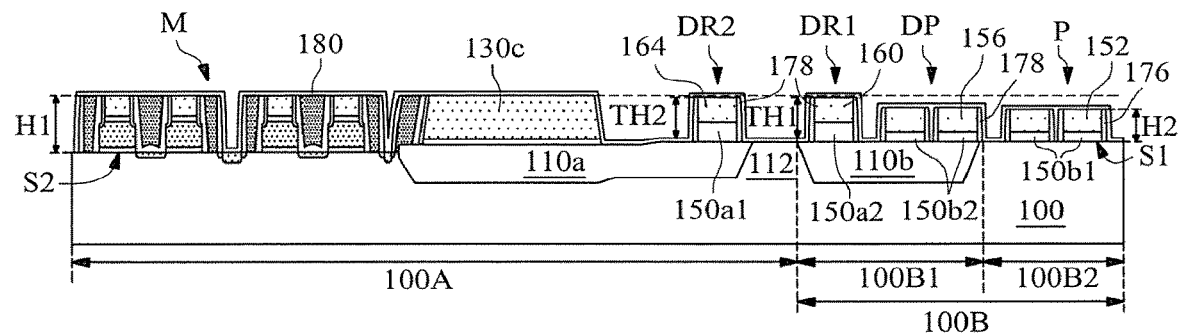

Referring to FIG. 27 and FIG. 28, an etching back process, for example, is performed to remove the dielectric caps 154, the dummy patterns 158, 162 and 166, the spacers 144a, the hard mask patterns 132b and the patterned hard mask layer 132d. During the above-mentioned polishing process, the dielectric layers 136c and the spacers 134a, 134b, 136a, 136b, 172, 176 and 178 are partially removed and the height thereof is reduced. After performing the polishing process, the patterned conductive layer 130c, the memory cell array M, a first dummy ring DR1, a second dummy ring DR2, a plurality of dummy dot patterns DP, and the periphery circuit P are revealed. The top surfaces of the first dummy ring DR1 and the second dummy ring DR2, for example, are substantial planar surfaces. The first dummy ring DR1 and the second dummy ring DR2 are disposed between the memory cell array M and the dummy dot patterns DP. The second dummy ring DR2 is disposed between the memory cell array M and the first dummy ring DR1. Since the second dummy ring DR2 is disposed between the memory cell array M and the first dummy ring DR1, the second dummy ring DR2 is an inner dummy ring and the first dummy ring DR1 is an outer dummy ring.

In some embodiments, the first dummy ring DR1, the second dummy ring DR2 and the dummy dot patterns DP are electrically floated because the first dummy ring DR1 and the dummy dot patterns DP are formed on the second trench isolation 110b and the second dummy ring DR2 is formed on the first trench isolation 110a. In other words, the first dummy ring DR1, the second dummy ring DR2 and the dummy dot patterns DP are electrically insulated from one another. Furthermore, the first dummy ring DR1, the second dummy ring DR2 and the dummy dot patterns DP are electrically insulated from other semiconductor devices (e.g., the memory cell array M and the periphery circuit P).

As shown in FIG. 28, in some embodiments, the patterned conductive layer 130c may be a ring-shaped structure and the memory cell array M is surrounded by the patterned conductive layer 130c. The first dummy ring DR1 is disposed on the dummy region 100B1 and the first dummy ring DR1 is located between the second dummy ring DR2 and the dummy dot patterns DP. The first dummy ring DR1 may be a film stack including the dielectric patterns 150a2, the dummy pattern 160 (e.g. polysilicon pattern) and the spacers 178, wherein the dummy pattern 160 is stacked on the dielectric patterns 150a2, and the spacers 178 cover the sidewalls of the dielectric patterns 150a2 and the dummy pattern 160. The second dummy ring DR2 may be a film stack including the dielectric patterns 150a1, the dummy pattern 164 (e.g. polysilicon pattern) and the spacers 178, wherein the dummy pattern 164 is stacked on the dielectric patterns 150a1, and the spacers 178 cover the sidewalls of the dielectric patterns 150a1 and the dummy pattern 164. Each of the dummy dot patterns DP may be a film stack including the dielectric patterns 150b2, the dummy pattern 156 (e.g. polysilicon pattern) and the spacers 178, wherein the dummy pattern 156 is stacked on the dielectric patterns 150b2, and the spacers 178 cover the sidewalls of the dielectric patterns 150b2 and the dummy pattern 156. For example, the material of the dielectric patterns 150a1, 150a2 and 150b2 may include oxide, nitride, oxynitride, the combinations. The material of the spacers 178 may include oxide, nitride, oxynitride, the combinations. The material of the dielectric patterns 150a1, 150a2 and 150b2, the material of the dummy pattern 156, 160 and 164 as well as the material of the spacers 178 are merely for illustration and the disclosure is not limited thereto.

As shown in FIG. 28, FIG. 34 and FIG. 35, the memory cell array M is surrounded the patterned conductive layer 130c. The memory cell array M and the periphery circuit P are spaced apart by the first trench isolation 110a and the second trench isolation 110b. The first dummy ring DR1 surrounds the memory cell array M. A first height H1 (e.g., a first gate height) of the memory cell array M is greater than a second height H2 (e.g., a second gate height) of the periphery circuit P, a first thickness TH1 of the first dummy ring DR1 and a second thickness TH2 of the second dummy ring DR2. The first thickness TH1 and the second thickness TH2 are substantially equal to each other and are greater than the second height H2. In other words, the top surface of the memory cell array M is higher than the top surface of the periphery circuit P, and the top surface of the memory cell array M may be slightly higher than or substantially equal to the top surfaces of the first dummy ring DR1 and the second dummy rings DR2. Furthermore, since the dielectric pattern 150a1 and the dielectric pattern 150a2 are thicker than the dielectric pattern 150b1 and the dielectric pattern 150b2, the top surfaces of the first dummy ring DR1 and the second dummy ring DR2 are higher than the top surfaces of the periphery circuit P and the dummy dot patterns DP. In some embodiments, the first dummy ring DR1 is thicker than the dummy dot patterns DP and the thickness difference ranges from about 10 angstroms to about 500 angstroms.

The level height difference between the surface S1 and the surface S2 of the semiconductor substrate 100 may reduce the gate height difference between the memory cell array M formed on the first region 100A and the periphery circuit P formed on the periphery circuit region 100B2.

Figure 29:
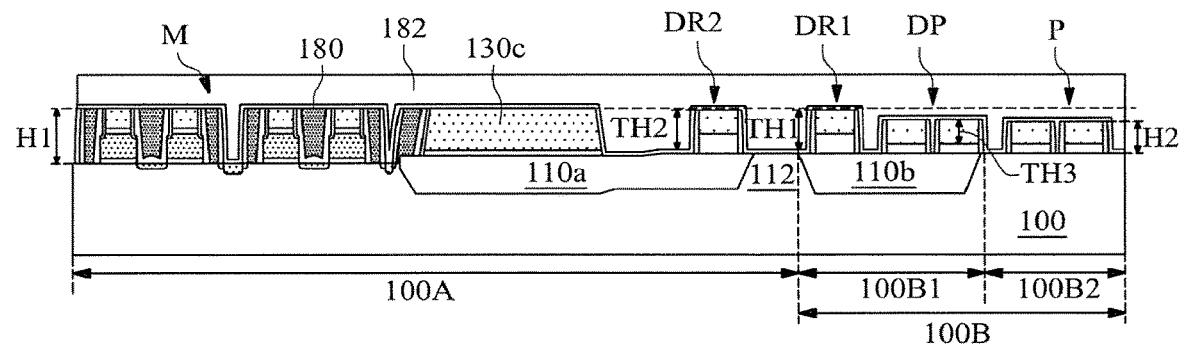

Referring to FIG. 28 and FIG. 29, a stop layer 180 is formed on the semiconductor substrate 100 to cover the memory cell array M, the patterned conductive layer 130c, the first dummy ring DR1, the second dummy ring DR2, the dummy dot patterns DP and the periphery circuit P. Then, an inter-layered dielectric layer 182 is formed on the etch stop layer 180. In some embodiments, the material of the etch stop layer 180 may include silicon oxide, silicon nitride (SiN) or silicon oxynitride (SiON) and the material of the inter-layered dielectric layer 182 may include phosphosilicate glass (PSG), borophosphosilicate glass (BPSG) or the like. The material of the etch stop layer 180 and the inter-layered dielectric layer 182 are merely for illustration and the disclosure is not limited thereto.

Figure 30:
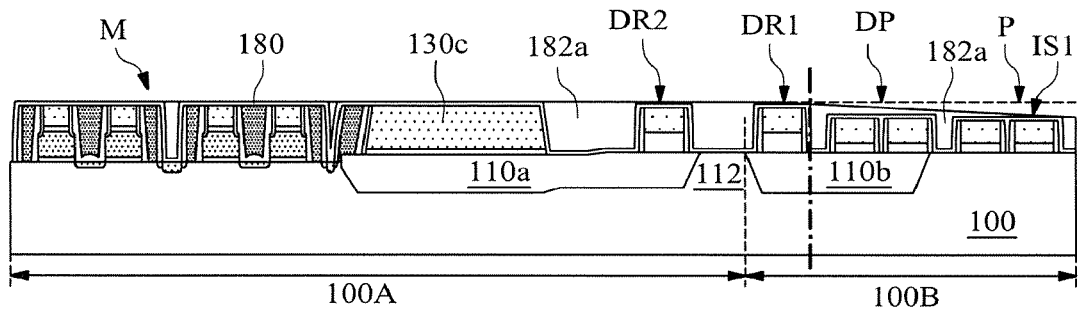

Referring to FIG. 29 and FIG. 30, an ILD polishing process (e.g., a CMP process) is performed on the inter-layered dielectric layer 182 until portions of the stop layer 180 are exposed. In some embodiments, portions of the stop layer 180 which cover top surfaces of the first dummy ring DR1, the second dummy ring DR2, the patterned conductive layer 130c and the memory cell array M may be exposed after performing the ILD polishing process. After the polishing process of the inter-layered dielectric layer 182 is performed, a polished inter-layered dielectric layer 182a is formed and CMP dishing may occur within the region above the dummy dot patterns DP and the periphery circuit P. As shown in FIG. 30, an inclined surface IS1 resulted from CMP dishing is generated. The first dummy ring DR1 distributed on the second region 100B is helpful to control the expanding of the CMP dishing. The inclined surface IS1 resulted from the ILD polishing process may be controlled in the second region 100B, for example. In other words, the expanding of the CMP dishing may be controlled by the first dummy ring DR1 such that the CMP dishing may not expand into the first region 100A after performing the ILD polishing process. In the situation that the first dummy ring DR1 distributed on the second region 100B is omitted, the CMP dishing may expand into the first region 100A after performing the ILD polishing process.

Figure 31:
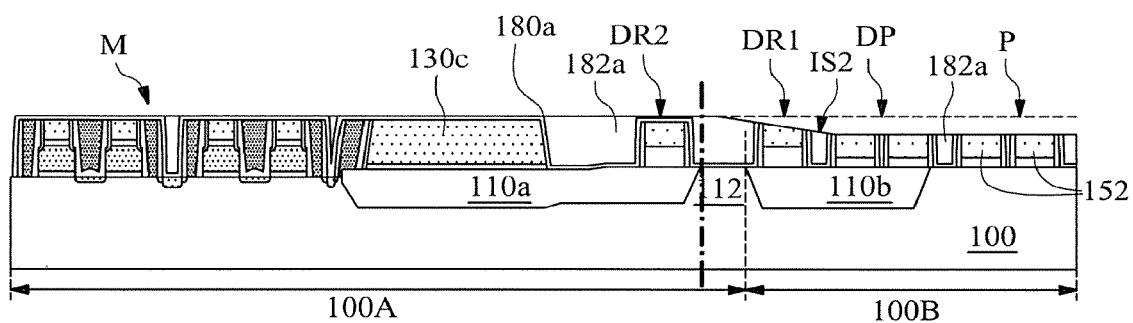

Referring to FIG. 31, a stop layer polishing process (e.g., a CMP process) is performed on the stop layer 180 until the top surfaces of the memory cell array M, the patterned conductive layer 130c, the first dummy ring DR1, the second dummy ring DR2, the dummy dot patterns DP and the periphery circuit P are exposed. After the polishing process of the stop layer 180 is performed, a polished and patterned stop layer 180a is formed and CMP dishing may occur within the region above the semiconductor portion 112, the first dummy ring DR1, the dummy dot patterns DP and the periphery circuit P. As shown in FIG. 31, another inclined surface IS2 resulted from CMP dishing is generated. In other words, compared to FIG. 30, the CMP dishing expands.

As shown in FIG. 31, during the polishing of the stop layer 180, since the first dummy ring DR1 is thicker than those of the dummy dot patterns DP and the periphery circuit P, the first dummy ring DR1 may retard the expanding of CMP dishing resulted from the stop layer polishing and the expending of dishing may be controlled. After performing the ILD polishing and the stop layer polishing, the memory cell array M is not affected by the CMP dishing phenomenon. In the situation that the first dummy ring DR1 distributed on the second region 100B is omitted, the CMP dishing may further expand into the first region 100A after performing the polishing of the stop layer 180.

Figure 32:
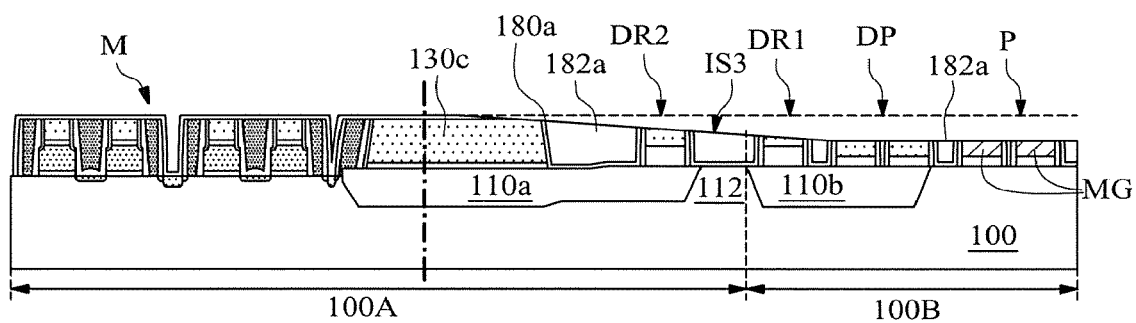

Referring to FIG. 31 and FIG. 32, in some embodiments, a gate replacement process may be performed to replace the gate electrodes 152 with metal gate electrodes MG. In some alternative embodiments, a gate replacement process may be performed to replace the gate electrodes 152 and the dummy patterns 156 with metal gate electrodes MG and metal patterns, respectively. During the gate replacement process, a metal gate polishing (e.g., a CMP process) is performed and the polished inter-layered dielectric layer 182a is further polished. After the polishing process of metal gate electrodes MG is performed, CMP dishing may occur within the region above the patterned conductive layer 130c, the semiconductor portion 112, the first dummy ring DR1, the dummy dot patterns DP and the periphery circuit P. As shown in FIG. 32, an inclined surface IS3 resulted from CMP dishing is generated. In other words, the CMP dishing further expands.

After performing the ILD polishing, the stop layer polishing and the polishing of the metal gate electrodes MG, a patterned dielectric layer (i.e. the polished and patterned stop layer 180a and the polished inter-layered dielectric layer 182a) may be formed to cover the semiconductor substrate 100. The memory cell array M, the periphery circuit P, the first dummy ring DR1 and the second dummy ring DR2 are embedded in the patterned dielectric layer (i.e. the polished and patterned stop layer 180a and the polished inter-layered dielectric layer 182a). As shown in FIG. 31, the top surface of the first dummy ring DR1 is slanted. Furthermore, the portion of the polished inter-layered dielectric layer 182a between the first dummy ring DR1 and the second dummy ring RD2 has a slanted top surface.

As shown in FIG. 32, during the polishing of the metal gate electrodes MG, since the first dummy ring DR1 and the second dummy ring DR2 are thicker than those of the dummy dot patterns DP and the periphery circuit P, the first dummy ring DR1 and the second dummy ring DR2 may retard the further expanding of CMP dishing resulted from the polishing of the metal gate electrodes MG and the expanding of CMP dishing may be controlled. In other words, after the polishing of the stop layer 180 and the polishing of the metal gate electrodes MG are performed, CMP dishing occurs within the region above the second region 100B and the first trench isolation 110a, and the dishing does not expand to affect the memory cell array M. Accordingly, the memory cell array M is not affected by the ILD polishing, the stop layer polishing and the gate replacement process. The yield rate of the memory cell array M thus increases. In the situation that the first dummy ring DR1 distributed on the second region 100B is omitted, the memory cell array M may be affected by the ILD polishing, the stop layer polishing and the gate replacement process.

After the polishing of the stop layer 180 and the polishing of the metal gate electrodes MG are performed, the thickness of the second dummy ring DR2 may be greater than the thickness of the first dummy ring DR1, the thickness of the at least one first dummy ring DR1 may be greater than the thickness of the dummy dot patterns DP, the height of the periphery circuit P may be substantially equal to the thickness of the dummy dot patterns DP. In some embodiments, the top surfaces of the first dummy ring DR1 and the second dummy ring DR2 may be slanted surfaces.

After the polishing of the stop layer 180 and the polishing of the metal gate electrodes MG are performed, the height of the memory cell array M is greater than the height of the periphery circuit P, the thickness of the first dummy ring DR1 and the thickness of the second dummy ring DR2. The top surface of the memory cell array M is higher than the top surface of the periphery circuit P, and the top surface of the memory cell array M may be higher than the top surfaces of the first dummy ring DR1 and the second dummy rings DR2. Furthermore, the top surfaces of the first dummy ring DR1 and the second dummy ring DR2 are higher than the top surfaces of the periphery circuit P and the dummy dot patterns DP.

As shown in FIG. 26 through FIG. 32, the thickness difference between the first portion 150a and the second portion 150b (shown in FIG. 26) causes the thickness difference between the first dummy ring DR1 and the dummy dot patterns DP. As shown in FIG. 30 through FIG. 32, during the polishing processes of the inter-layered dielectric layer 182, the stop layer 180 and the metal gate electrodes MG, the first dummy ring DR1 may serve as a retarder for retarding the CMP dishing from expanding toward the memory cell array M uncontrollably because of the thickness difference between the first dummy ring DR1 and the dummy dot patterns DP. Accordingly, the first dummy ring DR1 may protect the memory cell array M from damaging by CMP dishing.

FIG. 33 is a top view schematically illustrating a wafer including a plurality of integrated circuit components arranged in array according to some embodiments of the present disclosure; and FIG. 34 is an enlarged top view schematically illustrating the portion X shown in FIG. 33 according to some embodiments of the present disclosure.

Referring to FIG. 32, FIG. 33 and FIG. 34, the above-mentioned semiconductor structure (shown in FIG. 32) may be a wafer shown in FIG. 33 and the wafer may include a plurality integrated circuit components 200 arranged in array. Each of the integrated circuit components 200 may include the memory cell array M, the patterned conductive layer 130c, the first dummy ring DR1 (i.e. the outer dummy ring), the second dummy ring DR2 (i.e. the inner dummy ring), the dummy dot patterns DP and the periphery circuit P. From the top view illustrated in FIG. 33, the patterned conductive layer 130c, the first dummy ring DR1, the semiconductor portion 112 and the second dummy ring DR2 are ring-shaped structures. The memory cell array M is surrounded by the patterned conductive layer 130c, the first dummy ring DR1, the semiconductor portion 112 and the second dummy ring DR2. The patterned conductive layer 130c and the second dummy ring DR2 are disposed on the first trench isolation 110a and the first dummy ring DR1 and the dummy dot patterns DP are disposed on the second trench isolation 110b. The dummy dot patterns DP are distributed between the first dummy ring DR1 and the periphery circuit P.

FIG. 35 is an enlarged top view schematically illustrating the portion X shown in FIG. 33 according to some alternative embodiments of the present disclosure.

Referring to FIG. 33, FIG. 34 and FIG. 35, the integrated circuit components 200a illustrated in FIG. 35 is similar with the integrated circuit components 200 illustrated in FIG. 34 except that two first dummy rings DR1 are formed. The number of the first dummy rings DR1 is not limited in this application. Furthermore, the linewidth of each of the first dummy rings DR1 is not limited in this application.

In the above-mentioned embodiments, at least one dummy ring between the first device (e.g., the memory cell array M) and the second device (e.g., the periphery circuit P) is utilized to minimize the side effect resulted from the polishing processes. Accordingly, the first device (e.g., the memory cell array M) may be well protected and fabrication yield rate may be enhanced.

In accordance with some embodiments of the disclosure, a semiconductor structure including a semiconductor substrate and at least one patterned dielectric layer is provided. The semiconductor substrate includes a semiconductor portion, at least one first device, at least one second device and at least one first dummy ring. The at least one first device is disposed on a first region surrounded by the semiconductor portion. The at least one second device and the at least one first dummy ring are disposed on a second region, and the second region surrounds the first region. The at least one patterned dielectric layer covers the semiconductor substrate.

In accordance with some embodiments of the disclosure, a semiconductor structure including a semiconductor substrate and at least one patterned dielectric layer is provided. The semiconductor substrate includes an active region and a periphery region surrounding the active region, at least one first device disposed on the active region, at least one second device disposed on the periphery region, and at least one first dummy ring disposed on the periphery region. The at least one first device and the at least one second device are spaced apart by a semiconductor portion of the active region. The at least one patterned dielectric layer is disposed on the semiconductor substrate. The at least one first device, the at least one second device and the at least one first dummy ring are embedded in the patterned dielectric layer.

In accordance with some embodiments of the disclosure, a method of fabricating a semiconductor structure including the following steps is provided. A semiconductor substrate having a semiconductor portion is provided. At least one first device is formed on a first region surrounded by the semiconductor portion. At least one second device and at least one first dummy ring are formed on a second region, wherein the second region surrounds the first region, and the at least one first dummy ring surrounds the at least one first device. At least one dielectric layer is formed on the semiconductor substrate to cover the at least one first device, the at least one second device and the at least one first dummy ring. The at least one dielectric layer is polished until the at least one first device, the at least one second device and the at least one first dummy ring are exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate;
   a first device and a second device overlying the semiconductor substrate;
   a first trench isolation structure (TIS) and a second TIS recessed into a top of the semiconductor substrate and between the first device and the second device, wherein the first TIS is between the first device and the second TIS; and
   a first dummy ring completely overlying the second TIS and surrounding the first TIS.

2. The semiconductor structure according to claim 1, wherein the first TIS is spaced from the first device, and wherein the second TIS is spaced from the first TIS and the second device.

3. The semiconductor structure according to claim 1, wherein the first dummy ring comprises a dielectric pattern and a polysilicon pattern overlying the dielectric pattern, and further comprises a sidewall spacer on a common sidewall formed by the dielectric pattern and the poly silicon pattern.

4. The semiconductor structure according to claim 1, further comprising:
   a second dummy ring completely overlying the first TIS and surrounding the first device, laterally between the first device and the first dummy ring, wherein a top edge of the second dummy ring is elevated relative to a top edge of the first dummy ring.

5. The semiconductor structure according to claim 4, wherein the first dummy ring and the second dummy ring have individual top surfaces that are inclined with a same slope.

6. The semiconductor structure according to claim 1, further comprising:
an additional first dummy ring completely overlying the second TIS and surrounding the first dummy ring, laterally between the first dummy ring the and the second device.

7. The semiconductor structure according to claim 1, wherein the semiconductor structure has a ring-shaped top surface portion extending from the first TIS to the second TIS to separate the first and second TISs.

8. A semiconductor structure, comprising:
a semiconductor substrate;
a first device overlying the semiconductor substrate;
a trench isolation structure (TIS) recessed into the semiconductor substrate and extending in a closed path around the first device, wherein the TIS has a first sidewall and a second sidewall respectively facing and facing away from the first device;
a dummy ring surrounding the first device; and
a plurality of dummy dot gates in a ring-shaped pattern surrounding the first device;
wherein the plurality of dummy dot gates and the dummy ring are directly over the TIS and are laterally between the first and second sidewalls in a cross-sectional plane, and wherein the TIS is continuous from the first sidewall to the second sidewall in the cross-sectional plane.

9. The semiconductor structure according to claim 8, wherein the first and second sidewalls are ring shaped and surround the first device.

10. The semiconductor structure according to claim 8, wherein a top surface of the dummy ring is angled relative to individual top surfaces of the plurality of dummy dot gates.

11. The semiconductor structure according to claim 8, wherein the dummy ring is between the first device and the plurality of dummy dot gates.

12. The semiconductor structure according to claim 8, further comprising:
a second device on an opposite side of the TIS as the first device, wherein the second sidewall faces the second device.

13. The semiconductor structure according to claim 8, further comprising an additional TIS recessed into the semiconductor substrate, wherein the additional TIS separates the TIS from the first device and is spaced from the additional TIS and the first device.

14. The semiconductor structure according to claim 13, wherein the TIS and the additional TIS have individual ring-shaped top geometries that are concentric and that surround the first device.

15. A semiconductor structure, comprising:
a semiconductor substrate;
a first device and a second device on the semiconductor substrate;
a first trench isolation structure (TIS) and a second TIS both recessed into the semiconductor substrate and between the first and second devices, wherein the first TIS and the second TIS are spaced from each other and from the first and second devices, and further extend in individual ring-shaped paths around the first device, and wherein the first TIS is between the first device and the second TIS; and
a conductive ring-shaped wall having opposite sidewalls that respectively face the first device and the second device and that directly overlie the first TIS, wherein the conductive ring-shaped wall has a horizontal top surface portion level with the first device and further has an inclined top surface portion sloping downward from the horizontal top surface portion towards the second device.

16. The semiconductor structure according to claim 15, wherein the opposite sidewalls of the conductive ring-shaped wall comprise a first sidewall and a second sidewall, and wherein the first TIS is continuous from the first sidewall to the second sidewall when viewed in a cross-sectional plane.

17. The semiconductor structure according to claim 15, further comprising:
a dummy ring surrounding the first device, laterally between the conductive ring-shaped wall and the second device, wherein the dummy ring has a pair of sidewalls that overlie the second TIS and that respectively face the first device and the second device.

18. The semiconductor structure according to claim 17, wherein the pair of sidewalls of the dummy ring comprise a first sidewall and a second sidewall, and wherein the second TIS is continuous from the first sidewall to the second sidewall when viewed in a cross-sectional plane.

19. The semiconductor structure according to claim 15, wherein the inclined top surface portion of the conductive ring-shaped wall partially forms a larger inclined top surface that extends with a substantially uniform slope from a location directly over the first TIS to a location directly over the second TIS.

20. The semiconductor structure according to claim 15, wherein a thickness of the first TIS transitions from a first thickness to a second thickness less than the first thickness on a side of the conductive ring-shaped wall facing the second device.

* * * * *